United States Patent
Fujii et al.

(10) Patent No.: US 9,818,895 B2
(45) Date of Patent: Nov. 14, 2017

(54) SEMICONDUCTOR DEVICE, OPTICAL SENSOR DEVICE AND SEMICONDUCTOR DEVICE MANUFACTURING METHOD

(71) Applicant: Sumitomo Electric Industries, Ltd., Osaka-shi (JP)

(72) Inventors: Kei Fujii, Itami (JP); Katsushi Akita, Itami (JP); Takashi Ishizuka, Itami (JP); Hideaki Nakahata, Itami (JP); Yasuhiro Iguchi, Osaka (JP); Hiroshi Inada, Osaka (JP); Youichi Nagai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/694,278

(22) Filed: Apr. 23, 2015

(65) Prior Publication Data
US 2015/0228825 A1 Aug. 13, 2015

Related U.S. Application Data

(63) Continuation of application No. 13/505,226, filed as application No. PCT/JP2011/061519 on May 19, 2011, now Pat. No. 9,040,955.

(30) Foreign Application Priority Data

Jun. 3, 2010 (JP) ................................ 2010-128162

(51) Int. Cl.
*H01L 31/0352* (2006.01)
*B82Y 20/00* (2011.01)
(Continued)

(52) U.S. Cl.
CPC ...... *H01L 31/035236* (2013.01); *B82Y 20/00* (2013.01); *H01L 31/03046* (2013.01); *H01L 31/105* (2013.01); *H01L 31/1844* (2013.01)

(58) Field of Classification Search
CPC ............ B82Y 20/00; H01L 31/035236; H01L 31/1844; H01L 31/03046; H01L 31/105
(Continued)

(56) References Cited

U.S. PATENT DOCUMENTS 7,620,921 B2    11/2009  Foreman et al.
8,243,139 B2 *   8/2012  Nagai ................... B82Y 20/00
                                                      348/143
(Continued)

FOREIGN PATENT DOCUMENTS

JP    2005-197395 A    7/2005
JP    2009-206499      9/2009
(Continued)

OTHER PUBLICATIONS

Machine English translation of JP 2009-272385.*
(Continued)

*Primary Examiner* — Hrayr A Sayadian
(74) *Attorney, Agent, or Firm* — Venable LLP; Michael A. Sartori; Kerri M. Patterson

(57) ABSTRACT

Provided are a semiconductor device and an optical sensor device, each having reduced dark current, and detectivity extended toward longer wavelengths in the near-infrared. Further, a method for manufacturing the semiconductor device is provided. The semiconductor device 50 includes an absorption layer 3 of a type II (GaAsSb/InGaAs) MQW structure located on an InP substrate 1, and an InP contact layer 5 located on the MQW structure. In the MQW structure, a composition x (%) of GaAsSb is not smaller than 44%, a thickness z (nm) thereof is not smaller than 3 nm, and $z \geq -0.4x + 24.6$ is satisfied.

8 Claims, 10 Drawing Sheets

(51) Int. Cl.
*H01L 31/105* (2006.01)
*H01L 31/0304* (2006.01)
*H01L 31/18* (2006.01)

(58) Field of Classification Search
USPC .................. 257/18, 21, E31.033; 438/94
See application file for complete search history.

(56) References Cited

U.S. PATENT DOCUMENTS

| | | |
|---|---|---|
| 2005/0230672 A1 | 10/2005 | Kurihara et al. |
| 2008/0270953 A1 | 10/2008 | Foreman et al. |
| 2009/0310415 A1 | 12/2009 | Jin et al. |
| 2010/0072457 A1* | 3/2010 | Iguchi .................. B82Y 20/00 257/21 |
| 2010/0078701 A1 | 4/2010 | Shim et al. |
| 2011/0140082 A1 | 6/2011 | Iguchi et al. |
| 2011/0164136 A1* | 7/2011 | Nagai .................. B82Y 20/00 348/148 |

FOREIGN PATENT DOCUMENTS

| | | | |
|---|---|---|---|
| JP | 2009-272385 | 11/2009 | |
| JP | 2010067861 A | * 3/2010 | ............ B82Y 20/00 |

OTHER PUBLICATIONS

Sidhu et al., "A Long-Wavelength Photodiode on InP Using Lattice-Matched GaInAs—GaAsSb Type-II Quantum Wells," IEEE Photonics Technology Letters, vol. 17, No. 12, pp. 2715-2717 (Dec. 2005).

Peter et al., "Ligh-Emitting diodes and Laser Diodes Based on a $Ga_{1-x}In_xAs/GaAs_{1-y}Sb_y$ Type II Superlattice on InP Substrate," Applied Physics Letters, vol. 74, No. 14, pp. 1951-1953 (Apr. 5, 1999).

Peter et al., "Band Gaps and Band Offsets in Strained $GaAs_{1-y}Sb_y$ on InP Grown by Metalorganic Chemical Vapor Deposition," Applied Physics Letters, vol. 74, No. 3, pp. 410-412 (Jan. 18, 1999).

* cited by examiner

INCIDENT LIGHT

SEMICONDUCTOR DEVICE, OPTICAL SENSOR DEVICE AND SEMICONDUCTOR DEVICE MANUFACTURING METHOD

CROSS-REFERENCE TO RELATED APPLICATIONS

This application is a Continuation of U.S. patent application Ser. No. 13/505,226, filed on Apr. 30, 2012 which is a 371 application of International Application No. PCT/JP2011/061519, filed on May 19, 2011, which claims the benefit of priority of the prior Japanese Patent Application No. 2010-128162, filed on Jun. 3, 2010, the entire contents of all of which are incorporated herein by reference.

TECHNICAL FIELD

The present invention relates to a group III-V semiconductor device and a manufacturing method thereof. More particularly, the invention relates to: a semiconductor device in which an absorption layer includes a type II multiple quantum well (hereinafter, referred to as "MQW") structure having detectivity in a long wavelength region of the near-infrared; an optical sensor device adopting the semiconductor device; and a method for manufacturing the semiconductor device.

BACKGROUND ART

Non-Patent Literature 1 discloses a photodiode in which an InGaAs/GaAsSb type II MQW structure is formed on an InP substrate as a group III-V compound semiconductor substrate to realize a cut-off wavelength of 2 μm or more.

Meanwhile, Non-Patent Literature 2 discloses an LED and a laser diode, in which an InGaAs/GaAsSb type II MQW structure is formed as an active layer on an InP substrate to realize an emission wavelength of 2.14 μm. In the type II MQW structure, GaAsSb has an Sb composition of 34 at. % to 40 at. %, that is, a strain-compensated structure is adopted, in which the Sb composition is smaller than the lattice match composition with InP. Note that "at. %" is simply referred to as "%" in the following description.

Further, single-phase GaAsSb layers having different Sb compositions are grown on an InP substrate without forming type II MQW, and PL wavelengths are measured. Then, an InP/GaAsSb type II MQW LED is examined.

Meanwhile, Patent Literature 1 discloses a semiconductor laser device having a GaInNAsSb quantum well structure. This GaInNAsSb quantum well structure is a single quantum well structure (i.e., the number of pairs is 1).

CITATION LIST

Patent Literature

[PATENT LITERATURE 1] Japanese Laid-Open Patent Publication No. 2005-197395

Non Patent Literature

[NON PATENT LITERATURE 1] R. Sidhu, et. al. "A Long-Wavelength Photodiode on InP Using Lattice-Matched GaInAs—GaAsSb Type-II Quantum Wells, IEEE Photonics Technology Letters, Vol. 17, No. 12 (2005), pp. 2715 to 2717

[NON PATENT LITERATURE 2] M. Peter, et. al. "Light-emitting diodes and laser diodes based on a $Ga_{1-x}In_xAs/GaAs_{1-y}Sb_y$ type II superlattice on InP substrate" Appl. Phys. Lett., Vol. 74, No. 14 (5 Apr. 1999), pp. 1951 to 1953

[NON PATENT LITERATURE 3] M. Peter, et. al. "Band gaps and band offsets in strained $GaAs_{1-y}Sb_y$ on InP grown by metalorganic chemical vapor deposition" Appl. Phys. Lett., Vol. 74, No. 3 (18 Jan. 1999), pp. 410 to 412

SUMMARY OF THE INVENTION

Problems to be Solved by the Invention

In the above-mentioned semiconductor photodiode, it is desired to extend the detectivity toward longer wavelengths, for an increase in the application field. For this purpose, it is considered that the InGaAs/GaAsSb type II MQW may have a strain-compensated structure. In such an InGaAs/GaAsSb strain-compensated MQW structure, either of InGaAs and GaAsSb that form a pair is caused to generate a compressive stress while the other is caused to generate a tensile stress, thereby preventing a strain from occurring in the pair. In order to extend the detectivity toward longer wavelengths, it is desired that the InGaAs is caused to generate a tensile stress while the GaAsSb is caused to generate a compressive stress. In Non-Patent Literature 2, the Sb composition of the GaAsSb is lowered so that the GaAsSb is strained by the InGaAs. In this strain-compensated MQW structure, firstly, degradation of crystallinity is supposed. Therefore, there have been no cases where the strain-compensated MQW structure is used for the purpose of photodetection in which degradation of crystallinity leads directly to increase in dark current. That is, only the laser diode and the like disclosed in Non-Patent Literature 2 have been proposed, but there have been no cases where the strain-compensated MQW structure is used in photodiodes.

When forming an MQW structure having 100 to 300 repetitions (pairs), MBE (Molecular Beam Epitaxy) allows instant switching of molecular beams by means of a shutter. Therefore, MBE allows automatic switching of valves under microcomputer control, and it has been considered that film deposition by MBE is almost inevitable for growth of a high-quality MQW structure having sharp interfaces. In particular, if the problem regarding the crystal growth of a GaAsSb layer that is likely to cause phase separation is solely considered, a crystal growth method having a high non-equilibriumity is required in order to perform epitaxial growth while preventing such phase separation. Therefore, MBE, which is a crystal growth method having a high non-equilibriumity, is suitable. Actually MBE is used for formation of GaAsSb layers in Non-Patent Document 1.

The above-mentioned semiconductor devices are all targeted to near-infrared long-wavelength light. In this case, a cap layer or a contact layer located on the surface of the type II MQW structure is preferably composed of a material that does not absorb the long-wavelength light. Therefore, InP is often used for the contact layer. When growing InP by MBE, since solid phosphorus is used as a source, phosphorus (P) is attached to an inner wall of a growth chamber. When the growth chamber is opened for maintenance and then the attached phosphorus is exposed to the air, the phosphorus is likely to ignite. Therefore, a manufacturing method is adopted, in which an MQW structure is grown by MBE, and an InP contact layer is grown by a growth method other than MBE. When the manufacturing method is switched from MBE to, for example, OMVPE, an InP wafer as an interim product should be once exposed to the air. Such exposure to the air causes the InP wafer to be contaminated by impurities. Further, the above-mentioned switching of the growth method impedes manufacturing efficiency.

An object of the present invention is to provide: a semiconductor device having reduced dark current, and detectivity extended toward longer wavelengths in the near-infrared; an optical sensor device adopting the semiconductor device; and a method for manufacturing the semiconductor device.

Solution to the Problems

A semiconductor device of the present invention is formed on a group III-V semiconductor substrate. The semiconductor device includes an absorption layer of a type II MQW structure, located on the group III-V semiconductor substrate. The MQW structure is composed of a repetition of a layer containing at least Ga, As, and Sb, and a layer containing at least In, Ga, and As. The layer containing at least Ga, As, and Sb has an Sb composition x (at. %) not smaller than 44 at. %, and a thickness z (nm) not smaller than 3 nm, and $z \geq -0.4x+24.6$ is satisfied.

The layer containing at least Ga, As, and Sb and the layer containing at least In, Ga, and As in the MQW structure have substantially the same thickness within a range of variation of ±1.0 nm.

Therefore, in the following description, a thickness z of one layer (e.g., a GaAsSb layer) is reasonably understood as a thickness z of this layer or the other layer (e.g., an InGaAs layer).

The above invention adopts an increase in the quantum well thickness (factor (F1)) in order to extend the absorption wavelength region toward longer wavelengths. According to the above configuration, it is possible to extend the absorbable wavelength range toward longer wavelengths while maintaining reduced dark current without increasing the lattice defect density.

The thickness z (nm) of the layer containing at least Ga, As, and Sb is not smaller than 3 nm, and satisfies $z \geq -0.4x+24.6$ in relation to the Sb composition x ($\geq 44$ at %) of the layer containing at least Ga, As, and Sb. Such an increase in the thickness z is effective for extending the absorption wavelength region toward longer wavelengths. The x-z range limited by $z \geq -0.4x+24.6$ allows the absorbable long-wavelength region to be 2.4 μm or more. That is, the boundary $z=-0.4x+24.6$ is the x-z line formed by the Sb composition x and the thickness z which allow the maximum absorbable wavelength to be 2.43 μm.

The group III-V semiconductor may be InP. Thereby, a type II InP compound semiconductor MQW structure can be formed by using an InP substrate which has been frequently used, and thus a semiconductor device having detectivity on the long wavelength side in the near-infrared region can be easily obtained.

The MQW structure is a strain-compensated structure, and the Sb composition x of the layer containing at least Ga, As, and Sb and the In composition y (at. %) of the layer containing at least In, Ga, and As satisfy $100 \leq x+y \leq 104$.

The above invention adopts a strain-compensated structure (factor (F2)) in addition to the above-mentioned increase in the quantum well thickness (factor (F1)). According to the above configuration, in the MQW structure having the strain-compensated structure (factor (F2)), if the Sb composition x of the layer containing at least Ga, As, and Sb is increased while the In composition y of the layer containing at least In, Ga, and As is decreased, an energy difference between the valence band of the layer containing at least Ga, As, and Sb and the conduction band of the layer containing at least In, Ga, and As can be reduced while maintaining lattice match with InP (hereinafter, referred to as "InP lattice match"). As a result, the absorbable wavelength region can be extended toward longer wavelengths while maintaining reduced dark current without increasing the lattice detect density.

The relationship, $100 \leq x+y \leq 104$, between the Sb composition x of the layer containing at least Ga, As, and Sb and the In composition y of the layer containing at least In, Ga, and As is necessary for reducing the lattice defect density with the InP lattice match being maintained while increasing the Sb composition x from 44%.

An InP contact layer may be provided on the MQW structure. Thereby, the contact layer can be composed of a crystalline layer highly permeable to light on the long wavelength side in the near-infrared region. Further, an InP layer has been successfully used as a contact layer, and is excellent in surface smoothness, and therefore, has less hygroscopicity and excellent durability.

Preferably, the thickness z (nm) of the layer containing at least Ga, As, and Sb in the MQW structure is smaller than 10 nm ($z<10$ nm) when the Sb composition x is in a range of (a1) 44 at. % $\leq x \leq 56.8$ at. %, and is smaller than $-0.625x+45.5$ ($z<-0.625x+45.5$) when the Sb composition x is in a range of (a2) 56.8 at. % $\leq x \leq 68$ at. %.

As described above, (F1) an increase in the thickness of each layer in the MQW structure, and (F2) an increase in the Sb composition of the layer containing at least Ga, As, and Sb, and a decrease in the In composition of the layer containing at least In, Ga, and As (strain-compensated structure), are effective for extending the absorbable wavelength region. In particular, as for (F1) an increase in the thickness of each layer in the MQW structure, the thickness z of the layer containing at least Ga, As, and Sb is preferably controlled as follows in relation to dark current or detectivity.

In the range of (a1) 44 at. % $\leq x \leq 56.8$ at. %, it is not very difficult for the layer containing at least Ga, As, and Sb and the layer containing at least In, Ga, and As to maintain InP lattice match. Therefore, even if the thickness is increased and thereby deviation from precise lattice match is increased, degradation in crystallinity is small. Therefore, by increasing the thickness, the absorbable wavelength region can be extended toward longer wavelengths while maintaining reduced dark current. However, such increase in the thickness causes reduction in overlapping of the wave function of holes confined in the valence band of the layer containing at least Ga, As, and Sb and the wave function of electrons confined in the conduction band of the layer containing at least In, Ga, and As, which might lead to reduction in quantum efficiency and degradation in detectivity. If the thickness z of the layer containing at least Ga, As, and Sb is 10 nm or more, the detectivity is significantly reduced. In order to ensure the detectivity, the thickness z is preferably smaller than 10 nm.

In the range of (a2) 56.8 at. % $\leq x \leq 68$ at. %, the Sb composition x deviates toward the higher side from a range of the Sb composition x, in which the layer containing at least Ga, As, and Sb solely achieves InP lattice match. In this case, InP lattice match is achieved in the MQW structure only when the In composition y of the layer containing at least In, Ga, and As is decreased. Therefore, roughly speaking, the layer containing at least Ga, As, and Sb does not have the best characteristics of a crystalline layer, but barely maintains InP lattice match. Under such situation, if the thickness z of the layer containing at least Ga, As, and Sb is increased, deviation from the InP lattice match of the layer containing at least Ga, As, and Sb in the MQW structure becomes apparent (the same holds for the layer containing at least In, Ga, and As whose thickness is proportionally increased), and the lattice defect density increases (degrades) with the increase in the thickness z. As a result, dark current increases as the thickness z increases. Accordingly, in the region of such high Sb composition x, the dark current depends on the thickness z as well as on the Sb composition x of the layer containing at least Ga, As, and Sb. When the Sb composition x and the thickness z are in a range that satisfies $z < -0.625x + 45.5$, the dark current is in a practically allowable level.

Preferably, the thickness z (nm) of the layer containing at least Ga, As, and Sb in the MQW structure is not greater than 7 nm ($z \leq 7$ nm) when the Sb composition x is in a range of (b1) 44 at. % $\leq x \leq 54.3$ at. %, and is not greater than $-0.27x+21.7$ ($z \leq -0.27x+21.7$) when the Sb composition x is in a range of (b2) 54.3 at. % $\leq x \leq 68$ at. %. Thereby, it is possible to pursue an increase in detectivity on the long wavelength side in the near-infrared region, while emphasizing excellent crystallinity and reduced dark current.

Assuming that, in the MQW structure, a lattice mismatch of the layer containing at least In, Ga, and As is $\Delta\omega_1$ and a lattice mismatch of the layer containing at least Ga, As, and Sb is $\Delta\omega_2$, a lattice mismatch $\Delta\omega$ of the entire MQW structure is defined by $\Delta\omega = \{\Sigma(\Delta\omega_1 \times \text{thickness of the layer containing at least In, Ga, and As} + \Delta\omega_2 \times \text{thickness of the layer containing at least Ga, As, and Sb}\}/\{\Sigma(\text{thickness of the layer containing at least In, Ga, and As} + \text{thickness of the layer containing at least Ga, As, and Sb})\}$. Preferably, the $\Delta\omega$ is not smaller than $-0.2\%$ but not greater than $0.2\%$.

Here, it is defined that "if the lattice constant of the substrate is "a" and the lattice constant of the layer containing at least In, Ga, and As (e.g., InGaAs) is "$a_1$", the lattice mismatch $\Delta\omega_1$ of the layer containing at least In, Ga, and As (e.g., InGaAs) is $\Delta\omega_1 = \{(a-a_1)/a\} \times 100\%$". The same holds true for $\Delta\omega_2$. In the following description, the lattice mismatch is the same as above.

In the above configuration, each of the layer containing at least Ga, As, and Sb and the layer containing at least In, Ga, and As cannot solely satisfy InP lattice match. However, these layers in combination can achieve InP lattice match by deviating their lattice constants in opposite directions. Thus, it is possible to reduce the lattice defect density, and maintain reduced dark current, while varying the band structure so as to be advantageous for extension of the absorption wavelength region toward longer wavelengths.

The layer containing at least Ga, As, and Sb may be $GaAs_{1-x}Sb_x$ (GaAsSb, hereinafter). Thereby, a crystalline layer can be obtained, which is easy to lattice-match with the InP substrate, and has relatively high levels of conduction band and valence band which are advantageous conditions in forming one layer in the type II MQW.

The layer containing at least In, Ga, and As may be $In_yGa_{1-y}As$ (InGaAs, hereinafter). Thereby, a crystalline layer can be obtained, which is easy to lattice-match with the InP substrate, and has relatively low levels of conduction band and valence band which are advantageous conditions in forming the other layer in the type II MQW.

The maximum wavelength at which the absorption layer has detectivity is not shorter than 2.4 µm. By satisfying the above-mentioned x-y relationship, an energy difference between the valence band of the GaAsSb and the conduction band of the InGaAs can be reduced to a value corresponding to the wavelength of 2.4 µm or less. As a result, the semiconductor device becomes able to measure substances having an absorption band at 2.4 µm or more, and thus can be applied to test devices for a broader range of substances.

Preferably, the semiconductor device has no regrown interface between a bottom surface of the absorption layer and an upper surface of a semiconductor layer including the absorption layer and the InP contact layer.

The regrown interface is an interface between a first crystalline layer and a second crystalline layer which are grown in such a manner that the first crystalline layer is grown by a predetermined growth method and exposed to the atmosphere, and thereafter, the second crystalline layer is grown on and in contact with the first crystalline layer by another growth method. Usually, high concentrations of oxygen and carbon are mixed as impurities. Since the semiconductor device of the present invention does not have such regrown interface, excellent crystallinity can be ensured up to the surface of the InP contact layer, thereby contributing to reduction in dark current.

Further, it is possible to manufacture the semiconductor device efficiently. That is, as described later, since the layers, from the buffer layer through the MQW structure to the InP contact layer containing phosphorus (P), are consistently grown by all metal-organic source MOVPE, manufacturing of these layers can be continuously executed in the same growth chamber. Further, although the InP contact layer containing phosphorus is formed, since solid phosphorus is not used as a source, no phosphorus attaches to the inner wall of the growth chamber. Therefore, ignition or the like is not likely to occur at maintenance, resulting in excellent security.

An optical sensor device of the present invention adopts, as a photodiode, any of the above-mentioned semiconductor devices. Thereby, an optical sensor device can be obtained, which has reduced dark current, and detectivity on the long wavelength side in the near-infrared region. This optical sensor device may include: a CMOS having a readout electrode for each pixel of the semiconductor device (photodiode); a spectrometer (diffraction grating); optical elements such as a lens; a control device such as a microcomputer; and the like.

A manufacturing method of the present invention manufactures a semiconductor device on a group III-V semiconductor substrate. This manufacturing method includes a step of forming an absorption layer of a type II MQW structure on the group III-V semiconductor substrate. The MQW structure is composed of a layer containing at least Ga, As, and Sb, and a layer containing at least In, Ga, and As. In the MQW formation step, the Sb composition x (at. %) of the layer containing at least Ga, As, and Sb is not smaller than 44 at. %, and the Sb composition x (at. %) and the thickness z (nm) satisfy $z \geq -0.4x+24.6$.

Further, the group III-V semiconductor substrate may be InP.

The layer containing at least Ga, As, and Sb and the layer containing at least In, Ga, and As form a strain-compensated structure. When the Sb composition x of the layer containing at least Ga, As, and Sb is increased from 44 at. %, the In composition y (at. %) of the layer containing at least In, Ga, and As is decreased at a rate of 0.9 to 1.2 per increase of 1 at. % of the Sb composition x.

Further, the manufacturing method may include a step of forming an InP contact layer on the MQW structure.

Preferably, the thickness z (nm) of the layer containing at least Ga, As, and Sb in the MQW structure is not smaller than 3 nm, and is smaller than 10 nm ($z < 10$ nm) when the Sb composition x is in a range of (a1) 44 at. % $\leq x \leq 56.8$ at.

%, and smaller than −0.625x+45.5 (z≤−0.625x+45.5) when the Sb composition x is in a range of (a2) 56.8 at. %≤x≤68 at. %.

The semiconductor device manufactured by the above-mentioned method has reduced dark current, and detectivity extended toward longer wavelengths in the near-infrared.

Preferably, the thickness z (nm) of the layer containing at least Ga, As, and Sb in the MQW structure is not smaller than 3 nm, and is not greater than 7 nm (z≤7 nm) when the Sb composition x is in a range of (b1) 44 at. %≤x≤54.3 at. %, and not greater than −0.27x+21.7 (z≤−0.27x+21.7) when the Sb composition x is in a range of (b2) 54.3 at. %≤x≤68 at. %. Thereby, it is possible to pursue an increase in detectivity on the long wavelength side in the near-infrared region while ensuring excellent crystallinity.

In the MQW formation step, assuming that a lattice mismatch of the layer containing at least In, Ga, and As is $\Delta\omega_1$ and a lattice mismatch of the layer containing at least Ga, As, and Sb is $\Delta\omega_2$, a lattice mismatch $\Delta\omega$ of the entire MQW structure is defined by $\Delta\omega=\{\Sigma(\Delta\omega_1 \times \text{thickness of the layer containing at least In, Ga, and As} + \Delta\omega_2 \times \text{thickness of the layer containing at least Ga, As, and Sb}\}/\{\Sigma(\text{thickness of the layer containing at least In, Ga, and As} + \text{thickness of the layer containing at least Ga, As, and Sb})\}$. Preferably, the $\Delta\omega$ is not smaller than −0.2% but not greater than 0.2%. Thus, it is possible to maintain the crystalline quality of the MQW structure, and reduce the lattice defect density, while varying the band structures of the layer containing at least Ga, As, and Sb and the layer containing at least In, Ga, and As so as to be advantageous for extension of the absorption wavelength region toward longer wavelengths.

The layer containing at least Ga, As, and Sb may be GaAsSb.

Further, the layer containing at least In, Ga, and As may be InGaAs.

Preferably, semiconductor layers including the MQW structure and the InP contact layer are grown on the InP substrate consistently by metal-organic vapor phase epitaxy using only meta-organic sources. The metal-organic vapor phase epitaxy using only metal-organic sources is a growth method in which metal-organic sources composed of compounds of organic materials and metals are used as all sources for vapor phase epitaxy, and it is referred to as "all metal-organic source MOVPE".

According to the above-mentioned method, the above-mentioned semiconductor device can be manufactured efficiently. That is, since the layers up to the InP contact layer containing phosphorus are grown consistently by all metal-organic source MOVPE, manufacturing of these layers can be continuously executed in the same growth chamber. Further, even when an InP contact layer containing phosphorus is formed, since solid phosphorus is not used as a source, no phosphorus attaches to the inner wall of the growth chamber. Therefore, ignition or the like is not likely to occur at maintenance, resulting in excellent security.

The all metal-organic source MOVPE has another advantage in that an MQW structure having sharp heterointerfaces between the respective layers can be formed. The MQW structure with sharp heterointerfaces allows highly accurate spectrometry and the like.

In the MQW formation step, preferably, the MQW structure is formed at a temperature not lower than 400° C. but not higher than 560° C. Thereby, an MQW structure having excellent crystallinity is obtained, and dark current can be further reduced. The above "temperature" is the substrate surface temperature monitored by a pyrometer including an IR camera and an IR spectrometer. Accordingly, the substrate surface temperature is exactly the temperature at a surface of an epitaxial layer that is being grown on the substrate. Although the above "temperature" has various names such as "substrate temperature", "growth temperature", "deposition temperature" and the like, each indicates the monitored temperature.

Advantageous Effects of the Invention

According to the semiconductor device and the like of the present invention, it is possible to extend the detectivity toward longer wavelengths in the near-infrared, with the dark current being maintained at a low level. Further, since the layers from the MQW absorption layer to the InP contact layer are consistently grown by all metal-organic source MOVPE, high manufacturing efficiency is achieved. Further, since phosphorus does not attach to the inner wall of the growth chamber, excellent security is achieved.

BRIEF DESCRIPTION OF THE DRAWINGS

In FIG. 9, for example, 2 denotes Comparative Example 2, and encircled 5 denotes Example 5 of the present invention.

DESCRIPTION OF EMBODIMENTS

Embodiment 1

Figure 1:
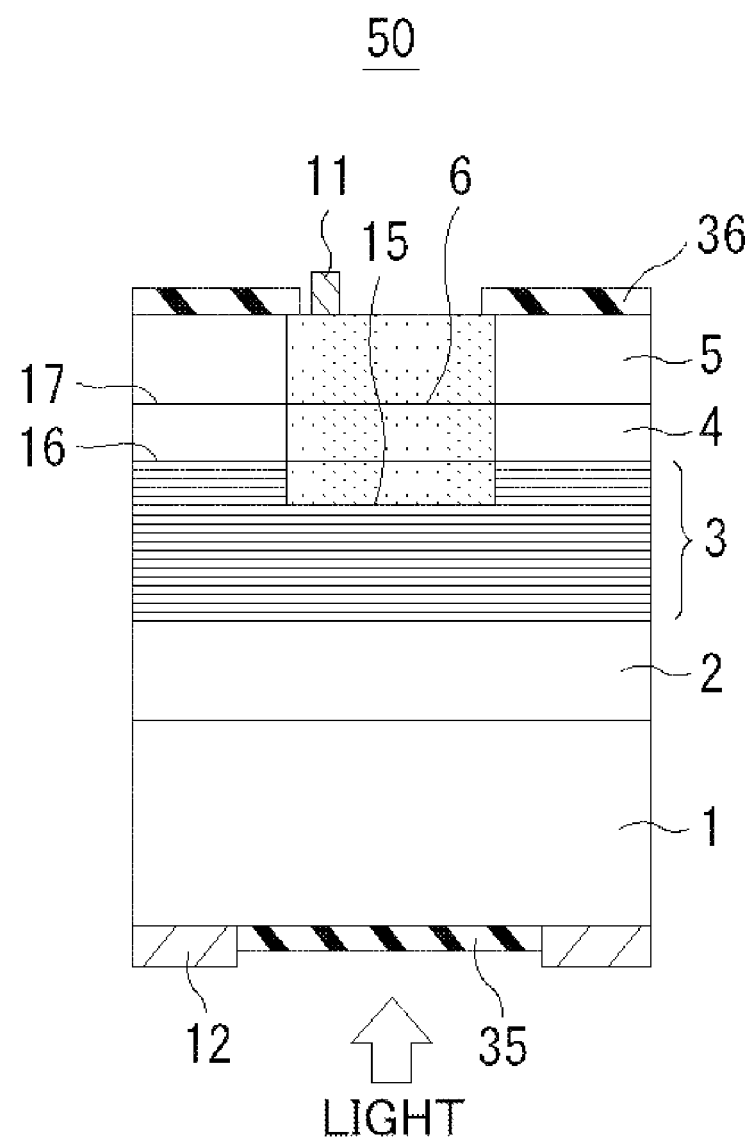
FIG. 1 is a diagram illustrating a semiconductor device according to a first embodiment of the present invention. At interfaces 16 and 17, an oxygen concentration and a carbon concentration are each smaller than $1 \times 10^{17}$ cm$^{-3}$. A thickness z of a GaAsSb layer is not smaller than 3 nm, and z (nm)≥−0.4x (at. %)+24.6 is satisfied, wherein x is an Sb composition of the GaAsSb layer.

FIG. 1 is a diagram illustrating a semiconductor device 50 according to a first embodiment of the present invention. A photodiode 50 includes, on an InP substrate 1, an InP-based semiconductor layered structure (epitaxial wafer) having a configuration described below. While in FIG. 1 light is incident on the InP substrate side, light may be incident on the epitaxial wafer side.

(an InP substrate 1/an InP buffer layer 2/a type II (InGaAs/GaAsSb) MQW absorption layer 3/an InGaAs diffusive-concentration-distribution-adjusting layer 4/an InP contact layer 5)

A p-type region 6 is located so as to reach into the MQW absorption layer 3 from the InP contact layer 5. The p-type region 6 is formed by selectively diffusing Zn as a p-type impurity from an opening of a selective diffusion mask pattern 36 that is an SiN film. The SiN selective diffusion mask pattern 36 allows the p-type impurity to be diffused and introduced into the inside of a peripheral part of the photodiode 50 in a limited manner when viewed in plan. A p-side electrode 11 composed of AuZn is disposed on and in ohmic contact with the p-type region 6, and an n-side electrode 12 composed of AuGeNi is disposed on and in ohmic contact with the rear surface of the InP substrate 1. In this case, the InP substrate 1 is doped with an n-type impurity, and has a predetermined level of conductivity. Further, the photodiode 50 includes an antireflection layer 35 composed of SiON on the rear surface of the InP substrate 1, so that the photodiode 50 can be used in such a manner that light is incident on the rear surface of the InP substrate. In the type II MQW absorption layer 3, a p-n junction 15 is formed at a position corresponding to a boundary front of the p-type region 6. By applying a reverse bias voltage between the p-side electrode 11 and the n-side electrode 12, a larger depletion layer is formed on the side where the n-type impurity concentration is lower (n-type impurity background). The background impurity concentration in the MQW absorption layer 3 is an n-type impurity concentration (carrier concentration) of about $5 \times 10^{15}$ cm$^{-3}$ or lower. The position of the p-n junction 15 is determined by an intersection between the background impurity concentration (n-type carrier concentration) of the MQW absorption layer 3, and the concentration profile of Zn that is a p-type impurity. The diffusive-concentration-distribution-adjusting layer 14 is provided in order to adjust the concentration distribution of the p type impurity in the MQW structure constituting the absorption layer 3. However, the diffusive-concentration-distribution-adjusting layer 14 may not be necessarily formed. In the absorption layer 3, the Zn concentration is preferably $5 \times 10^{16}$ cm$^{-3}$ or lower.

The following will describe the points of the photodiode of the present embodiment.

(P1) The absorption layer 3 is composed of the type II (InGaAs/GaAsSb) MQW structure, the Sb composition x of the GaAsSb is not smaller than 44%, and the Sb composition x of the GaAsSb is increased while the In composition y of the InGaAs is decreased so as to absorb the increase of the Sb composition x and maintain InP lattice match as a whole. That is, the GaAsSb and the InGaAs form a strain-compensated structure. This point (P1) is identical to factor (F2) that extends the absorption wavelength region toward longer wavelengths in the near-infrared. The factor (F2) will be described later.

(P2) The thickness z of a unit quantum well (GaAsSb) is not smaller than 3 nm, and satisfies z≥−0.4x (%)+24.6. This feature mainly includes the above-mentioned factor (F1) an increase in the thickness, and secondary includes the factor (F2).

According to the point (P1), an increase in the Sb composition x and a decrease in the In composition y allow reduction in the energy difference between the valence band of the GaAsSb and the conduction band of the InGaAs. In addition, maintaining InP lattice match allows growth of an MQW, a contact layer, and the like having low lattice defect density. As a result, it is possible to extend the absorption wavelength region toward longer wavelengths while keeping the dark current at a low level.

Further, according to the point (P2), the absorbable long-wavelength region can be 2.4 μm or more.

Further, since no regrown interface exists, incorporation of high concentration oxygen and carbon as impurities is avoided. As a result, excellent crystallinity is maintained up to the surface of the InP contact layer, resulting in reduced dark current.

<Extension of Absorption Wavelength Region Toward Longer Wavelengths in Near-Infrared>

There are two factors as follows, which extend the absorption wavelength region of the type II (GaAsSb/InGaAs) MQW structure toward longer wavelengths in the near-infrared.

Figure 2:
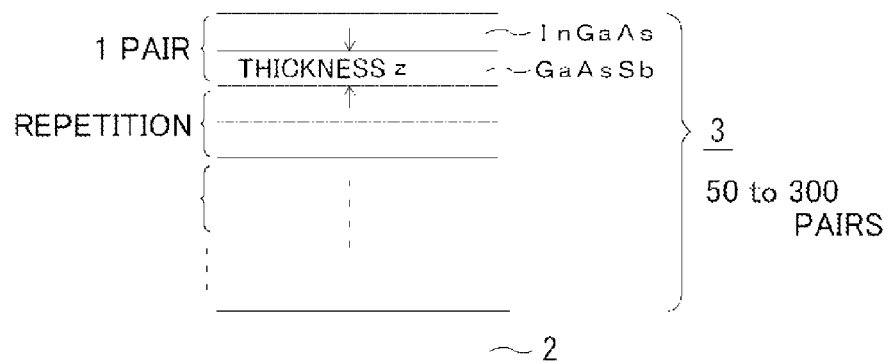
FIG. 2 is an enlarged view of an MQW structure shown in FIG. 1.

(F1) an increase in the thickness of each layer in the MQW structure. In the present embodiment, as shown in FIG. 2, the thickness z of the GaAsSb is used as an indicator. Since the thickness of the InGaAs is within a range of ±1.0 nm of the thickness z of the GaAsSb, these thicknesses are regarded to be substantially the same.

(F2) an increase in the Sb composition x to 44% or more and a decrease in the In composition in the GaAsSb/InGaAs. The factor (F2) can be regarded as formation of a strain-compensated structure from the viewpoint of InP lattice match. However, from the viewpoint of band structure, the factor (F2) is reduction in the energy difference between the valence band of the GaAsSb and the conduction band of the InGaAs. A weak point of the factor (F2) is securing of InP lattice match or reduction in lattice defect density.

Figure 3:
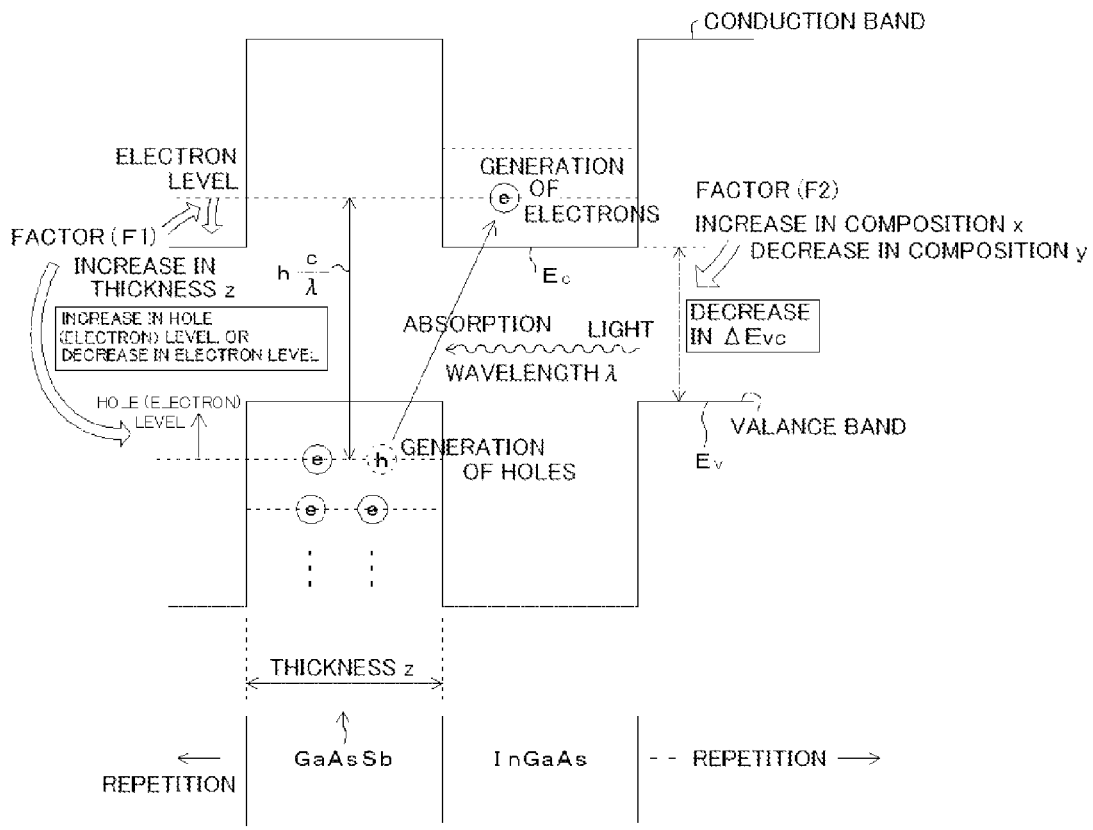
FIG. 3 is a diagram illustrating a type II (InGaAs/GaAsSb) band structure, and a light absorption (reception) phenomenon.

The factor (F1) an increase in the thickness, and the factor (F2) setting of the compositions x and y will be described with reference to FIG. 3. FIG. 3 is a diagram illustrating the type II (InGaAs/GaAsSb) band structure, and light absorption (reception). When light of a long wavelength λ is absorbed, electrons that have occupied the level of the valence band of the GaAsSb are excited, and the excited electrons occupy the level of the conduction band of the InGaAs. As a result of the light absorption, holes are generated in the valence band. In the type II band structure, since the electrons are excited from the valence band of the GaAsSb to the conduction band of the InGaAs, the energy difference is reduced as compared with that caused by electron transition from the valence band to the conduction band in a single-phase structure, thereby realizing absorption of the long-wavelength light.

When the light of the long wavelength λ is absorbed, the energy difference between the generated holes and electrons is represented by $h \cdot (c/\lambda)$, where h is Plank's constant ($6.626 \times 10^{-34}$ J·s), and c is the velocity of light in the medium. In order to extend the absorption wavelength region toward longer wavelengths, it is necessary to bring the both ends of an arrow of $h \cdot (c/\lambda)$ shown in FIG. 3 close to each other. As shown in FIG. 3, the factor (F2) reduces the energy difference ΔEvc between the valence band of the GaAsSb and the conduction band of the InGaAs. That is, the energy difference ΔEvc is reduced by changing the band structure in which the electron level is formed. Further, it is considered that the factor (F1) influences as follows. A single layer in the MQW structure forms a single well potential. The energy level of electrons generated in the well potential tends to increase with reduction in the width (thickness) of the well potential. Such increase in the energy level corresponds to that when particles having wave-like nature, such as electrons, are confined in a small space, the energy state thereof is increased as compared with the case where the particles are diffused in a large space, and therefore, can be regarded as a universal nature. If the thickness z is increased, the energy level of electrons (holes) shown in FIG. 3 approaches the valence band and the conduction band. As a result, light absorption is achieved even if the wavelength λ is increased and the h·(c/λ) is reduced.

Figure 4:
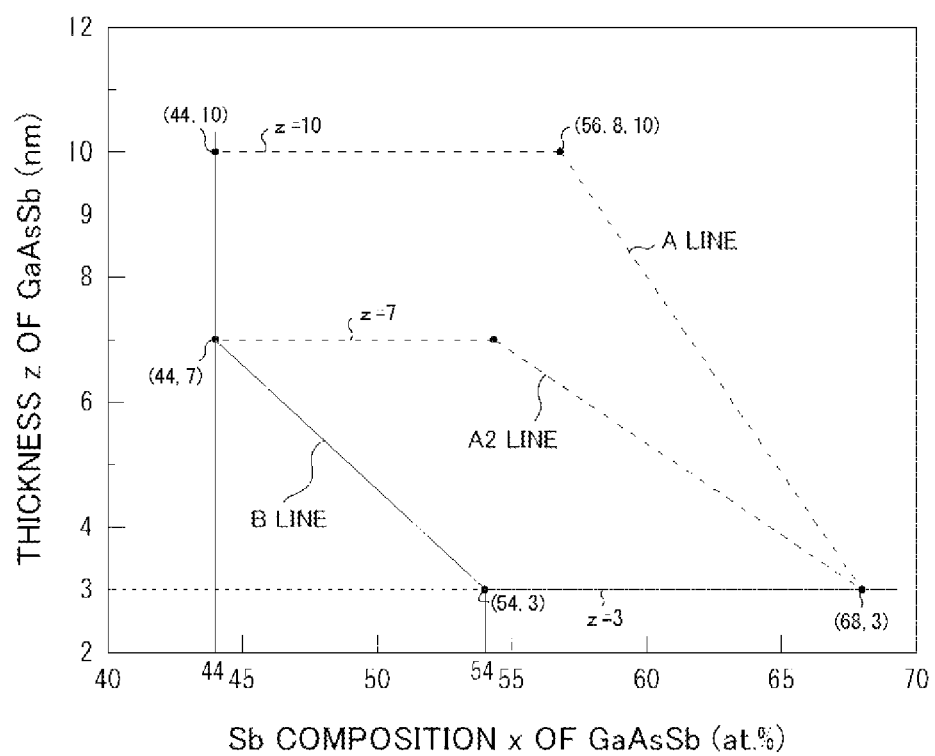
FIG. 4 is a diagram illustrating a range satisfied by an Sb composition x (%) of GaAsSb and a thickness z (nm) of GaAsSb in a type II (InGaAs/GaAsSb) MQW structure. A line indicates z=−0.625x+45.5, A2 line indicates z=−0.27x+21.7, and B line indicates z=−0.4x+24.6.

FIG. 4 is a diagram illustrating a range that is defined by the Sb composition x (%) of the GaAsSb and the thickness z of the GaAsSb in the type II InGaAs/GaAsSb MQW structure in the photodiode 50 of the present embodiment. The In composition y of the InGaAs is set so as to satisfy 100≤x+y≤104. The meaning of each boundary line shown in FIG. 4 will be described below. The reason of setting the range shown in FIG. 4 will be described for Example 1 (refer to FIG. 9).

1. B line: $z=-0.4x+24.6$

The B line defines the composition x and the thickness z, with which the maximum absorbable wavelength is 2.43 μm. In a range where z is on or higher than the B line, i.e., in an x-z region on or higher than the B line, the maximum absorption wavelength is 2.4 μm or more. In the present invention, in order to achieve the maximum wavelength of 2.4 μm or more, the thickness z is set to be equal to or higher than the B line.

2. x=44

The Sb composition x=44(%) is a line in which the maximum wavelength of 2.3 μm is ensured regardless of the thickness z. When the Sb composition x is 44% or more, and then if the thickness z is 7 nm or more, the maximum wavelength of 2.3 μm or more is achieved. In the present embodiment, the Sb composition x is 44(%) or more.

3. z=3

In the present invention, in order to ensure detectivity, the thickness z is 3 nm or more.

4. A line: $z=-0.625x+45.5$

This A line defines a boundary beyond which dark current increases. In a range including and outside the A line (in a range where z is on or higher than the A line), dark current increases, and the S/N ratio decreases.

In a region inside the A line (in a region where z is positioned under the A line), the thickness z increases and the Sb composition x increases as approaching the A line, and thereby the absorption wavelength region is extended toward longer wavelengths. In the present embodiment, if low dark current is emphasized, the x-z range can be set inside the A line. As described above, unless both the thickness z and the Sb composition x approach the A line, it is not possible to realize a semiconductor device in which an absorption wavelength region is extended toward longer wavelengths in the near-infrared, such semiconductor device being expected for wide practical applications.

5. A2 line: $z=-0.27x+21.7$

However, in the case where reduction in dark current is emphasized, in order to realize excellent crystallinity, it is preferable that the thickness z is set to satisfy z≤7 nm when the Sb composition x is in a range of (b1) 44 at. %≤x≤54.3 at. %, and is set to satisfy z≤−0.27x+21.7 (A2 line) when the Sb composition x is in a range of (b2) 54.3 at. %≤x≤68 at. %. The A2 line will be described in detail for Examples.

6. z=10

Detectivity limit is defined by z=10 nm. That is, when the thickness z is 10 nm, overlapping of wave functions of electrons and holes is reduced, which causes reduction in detectivity. That is, the probability of transition of electrons from the valence band of the GaAsSb to the conduction band of the InGaAs is lowered, and transition of such electrons (absorption) is less likely to occur. This is caused by requirements in quantum mechanics. If the thickness z is thinner than 10 nm, i.e., if z<10 is satisfied, detectivity can be ensured.

7. z=7

However, when the detectivity is emphasized, it is preferable that z≤7 (nm) is satisfied.

<MQW Growth Method>

A description will be given of a manufacturing method. An InP substrate 1 is prepared. On the InP substrate 1, an InP buffer layer 2, a type II (InGaAs/GaAsSb) MQW absorption layer 3, an InGaAs diffusive-concentration-distribution-adjusting layer 4, and an InP contact layer 5 are grown by all metal-organic source MOVPE. In this embodiment, a method for growing the type II (InGaAs/GaAsSb) MQW absorption layer 3 will be described in detail.

Figure 5:
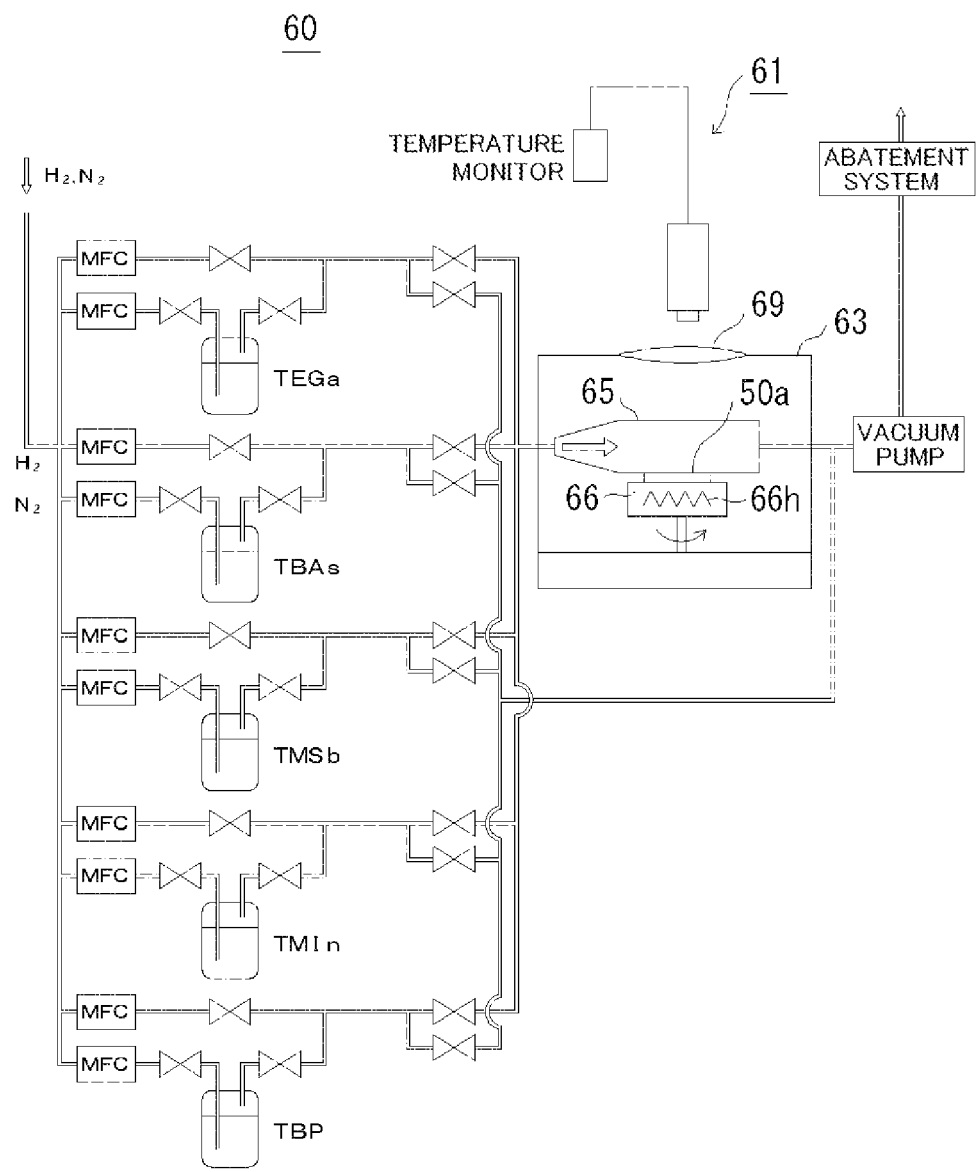
FIG. 5 is a diagram illustrating a piping system and the like of a growth system for all metal-organic source MOVPE.

FIG. 5 illustrates a piping system and the like of a growth system 60 for all metal-organic source MOVPE. A quartz tube 65 is placed inside a reaction chamber 63, and source gases are introduced into the quartz tube 65. In the quartz tube 65, a substrate table 66 is placed rotatably and hermetically. The substrate table 66 is provided with a heater 66h for heating a substrate. The temperature at a surface of a wafer 50a during deposition is monitored by an IR temperature monitor 61 through a window 69 provided at a ceiling of the reaction chamber 63. The monitored temperature is a temperature which is referred to as a temperature at which growth is performed, or a deposition temperature, or a substrate temperature. When it is described that an MQW structure is formed at a temperature not lower than 400° C. but not higher than 560° C. in the manufacturing method of the present invention, this temperature ranging from 400° C. to 560° C. is a temperature measured by the temperature monitor. Forced evacuation from the quartz tube 65 is performed by means of a vacuum pump.

Source gases are supplied through pipes connected to the quartz tube 65. All metal-organic source MOVPE is characterized by that all source gases are supplied in forms of metal-organic gases. Although source gases of dopants or the like are not shown in FIG. 5, dopants are also supplied in forms of metal-organic gases. The metal-organic gases are stored in a constant temperature bath and kept at a constant temperature. Hydrogen ($H_2$) and nitrogen ($N_2$) are used as carrier gases. The metal-organic gases are carried by the carrier gases, and evacuated by the vacuum pump to be introduced into the quartz tube 65. The amount of the carrier gases is precisely controlled by mass flow controllers (MFCs). Many MFCs, electromagnetic valves, and the like are automatically controlled by a microcomputer.

A method for manufacturing the wafer 50a will be described. First, an n-type InP buffer layer 2 is epitaxially grown to a thickness of 150 nm on an S-doped n-type InP substrate 1. Tetraethylsilane (TeESi) is used as an n-type dopant. At this time, trimethylindium (TMIn) and tertiary-butylphosphine (TBP) are used as source gases. The InP buffer layer 2 may be grown by using phosphine ($PH_3$) as an inorganic source. Even if the InP buffer layer 2 is grown at a growth temperature of about 600° C. or lower, the crystallinity of the underlying InP substrate is not degraded by the heating at about 600° C. However, when forming an InP contact layer, since the MQW structure including GaAsSb is disposed under the InP contact layer, the substrate temperature needs to be precisely maintained within a range of, for example, not lower than 400° C. but not higher than 560° C. The reason is as follows. If the wafer is heated to about 600° C., the GaAsSb is damaged by the heat, and its crystallinity is significantly degraded. In addition, if the InP contact layer is formed at a temperature lower than 400° C., the source gas decomposition efficiency is significantly reduced, and thereby the impurity concentration in the InP layer is increased. Therefore, a high-quality InP contact layer cannot be obtained. Next, an n-doped InGaAs layer is grown to a thickness of 0.15 μm (150 nm) on the InP buffer layer 2. This InGaAs layer is also included in the buffer layer 2 in FIG. 1.

Next, a type II MQW absorption layer 3 having InGaAs/GaAsSb as a pair of quantum wells. As described above, in the quantum well structure, the GaAsSb preferably has a thickness z not smaller than 3 nm but smaller than 10 nm, and the InGaAs preferably has a thickness of z±1.0 nm. Thus, these layers have substantially the same thickness. In FIG. 1, 250 pairs of quantum wells are deposited to form the MQW absorption layer 3. For deposition of the GaAsSb, triethylgallium (TEGa), tertiarybutylarsine (TBAs), and trimethylantimony (TMSb) are used. For deposition of the InGaAs, TEGa, TMIn, and TBAs are used. All the source gases are organic-metal gases, and the molecular weight of each compound is great. Therefore, the source gases are completely decomposed at a relatively low temperature not lower than 400° C. but not higher than 560° C., thereby contributing to the crystal growth. The composition change at an interface of quantum wells can be made sharp by forming the MQW absorption layer 3 by all metal-organic source MOVPE. As a result, highly accurate spectrophotometry is achieved.

As a source of gallium (Ga), triethylgallium (TEGa) or trimethylgallium (TMGa) may be used. As a source of indium (In), trimethylindium (TMIn) or triethylindium (TEIn) may be used. As a source of arsenic (As), tertiarybutylarsine (TBAs) or trimethylarsenic (TMAs) may be used. As a source of antimony (Sb), trimethylantimony (TMSb) or triethylantimony (TESb) may be used. Alternatively, triisopropylantimony (TIPSb) or trisdimethylaminoantimony (TDMASb) may be used. By using these sources, a semiconductor device in which an MQW structure has low impurity concentration and excellent crystallinity can be obtained. As a result, if the semiconductor device is applied to, for example, a photodiode, a photodiode having reduced dark current and high detectivity can be obtained. Moreover, by using the photodiode, an optical sensor device, such as an imaging device, capable of taking clearer images can be realized.

Next, a description will be given of how the source gases flow during formation of the MQW structure 3 by all metal-organic source MOVPE. The source gases are carried through the pipes, introduced into the quartz tube 65, and evacuated. Many kinds of source gases can be supplied to the quartz tube 65 by increasing the number of pipes. For example, even if dozen kinds of source gases are used, the source gases are controlled by open/close of the electromagnetic valves.

Flow of each source gas into the quartz tube 65 is turned on/off according to open/close of the electromagnetic valve, with the flow rate of the source gas being controlled by the mass flow controller (MFC) shown in FIG. 5. Then, the source gases are forcibly evacuated from the quartz tube 65 by the vacuum pump. The flow of the source gases is not interrupted but smoothly and automatically conducted. Accordingly, switching of compositions when forming the pairs of quantum wells is quickly performed.

Since the substrate table 66 rotates as shown in FIG. 5, the source gas temperature distribution does not have a directionality such that the source gas temperature is higher/lower at the source gas inlet side than at the source gas outlet side. Further, since the wafer 50a revolves on the substrate table 66, the flow of the source gas near the surface of the wafer 50a is in a turbulence state. Therefore, even the source gas near the surface of the wafer 50a, excluding the source gas contacting the wafer 50a, has a great velocity component in the direction of gas flow from the gas inlet side toward the gas outlet side. Accordingly, the heat, which flows from the substrate table 66 through the wafer 50a to the source gas, is mostly exhausted together with the exhaust gas, constantly. This causes a great temperature gradient or temperature gap in the vertical direction from the wafer 50a through its surface to the source gas space.

Further, in the embodiment of the present invention, the substrate temperature is set in a low temperature range of not lower than 400° C. but not higher than 560° C. When all metal-organic source MOVPE using metal-organic sources such as TBAs is performed at such a low substrate surface temperature, the decomposition efficiency of the source is high. Therefore, the source gases, which flow in a region very close to the wafer 50a and contribute to the growth of the MQW structure, are limited to those efficiently decomposed into a form required for the growth.

Figure 6A:
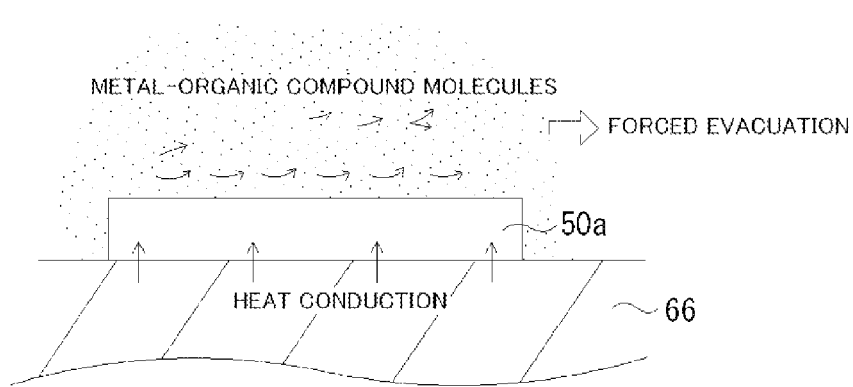
FIG. 6A is a diagram illustrating the flow of metal-organic molecules and the flow of heat.
Figure 6B:
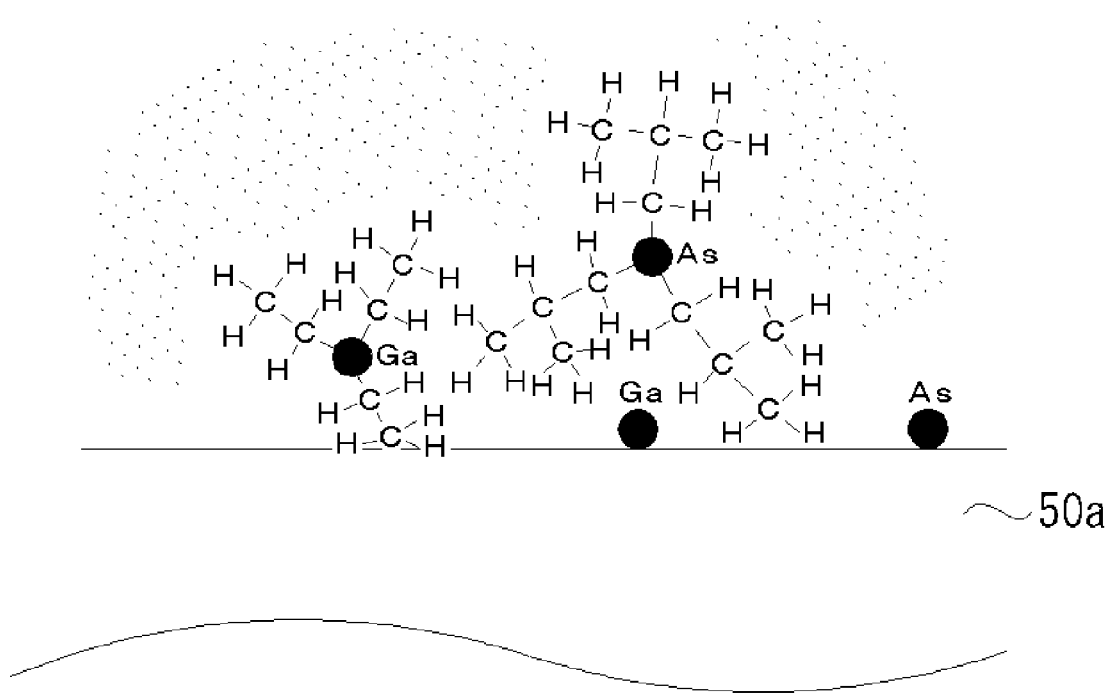
FIG. 6B is a schematic diagram illustrating the metal-organic molecules at a substrate surface.

FIG. 6A is a diagram illustrating the flow of metal-organic molecules and the flow of heat, and FIG. 6B is a schematic diagram illustrating the metal-organic molecules at the substrate surface. These figures are used for explaining that setting of the surface temperature is important in order to obtain sharp composition change at heterointerfaces in the MQW structure.

Although it is assumed that the surface of the wafer 50a is at the monitored temperature, a sudden temperature drop or a great temperature gap occurs as described above in the source gas space a little above the wafer surface. Therefore, in the case of using a source gas whose decomposition temperature is T1° C., the substrate surface temperature is set at (T1+α), and the α is determined in view of variation in temperature distribution and the like. Under the situation where a sudden temperature drop or a great temperature gap occurs from the surface of the wafer 50a to the source gas space, if large-size metal-organic molecules as shown in FIG. 6B flow against the wafer surface, the compound molecules that are decomposed and contribute to crystal growth are considered to be limited to those that contact the wafer surface and those in a range equivalent to the thicknesses of a few metal-organic molecules from the wafer surface. Accordingly, as shown in FIG. 6B, it is considered that the metal-organic molecules contacting the wafer surface and the metal-organic molecules located within the region equivalent to the thicknesses of a few metal-organic molecules from the wafer surface mainly contribute to crystal growth, while the metal-organic molecules located outside the region are less likely to be decomposed and are evacuated from the quartz tube 65. When the metal-organic molecules near the surface of the wafer 50a are decomposed and contribute to crystal growth, the metal-organic molecules located outside the region enter the region as supplemental molecules.

Taking the converse point of view, by setting the wafer surface temperature at a temperature slightly higher than the decomposition temperature of the metal-organic molecules, the range of the metal-organic molecules that can participate in crystal growth can be limited to the thin source gas layer on the surface of the wafer 50a.

As understood from the above description, when the source gases suited to the chemical compositions of the above-described pair are introduced by switching the gases using the electromagnetic valves while forcibly evacuating the gases using the vacuum pump, the crystal growth is performed such that, after a crystal of the previous chemical composition was grown with slight inertia, a crystal of the chemical composition, to which the source gases have been switched, can be grown without being affected by the previous source gases. As a result, the composition change at the heterointerface can be made sharp. Such a sharp composition change means that the previous source gases do not substantially remain in the quartz tube 65, and is caused by that the source gases that flow in the region very close to the wafer 50a and contribute to the growth of the MQW structure are limited those efficiently decomposed into the form required for the growth (deposition factor 1). Specifically, as seen from FIG. 5, after one of the two layers in the quantum well is formed, the source gases for forming the other layer is introduced by opening/closing the electromagnetic valves while forcibly evacuating the gases with the vacuum pump. At this time, although some metal-organic molecules that participate in the crystal growth with slight inertia remain, the molecules of the one layer that may act as supplemental molecules are mostly evacuated and gone. As the wafer surface temperature is set closer to the decomposition temperature of the metal-organic molecules, the range of the metal-organic molecules that participate in the crystal growth (the range from the wafer surface) is reduced.

In the case of forming the MQW structure, if the MQW structure is grown at a temperature of about 600° C., phase separation occurs in the GaAsSb layers in the MQW structure, which makes it impossible to realize a clean and flat crystal growth surface of an MQW structure, and an MQW structure having excellent periodicity and crystallinity. Therefore, the growth temperature is set in the range of not lower than 400° C. but not higher than 560° C. (deposition factor 2), and all metal-organic source MOVPE is adopted as a deposition method for this growth, in which metal-organic gases having high decomposition efficiency are used as all source gases (deposition factor 3). The deposition factor 1 significantly depends on the deposition factor 3.

<Semiconductor Device Manufacturing Method>

In the semiconductor device 50 shown in FIG. 1, the InGaAs diffusive-concentration-distribution-adjusting layer 4 is located on the type II MQW absorption layer 3, and the InP contact layer 5 is located on the InGaAs diffusive-concentration-distribution-adjusting layer 4. Zn as a p type impurity is selectively diffused from the opening of the selective diffusion mask pattern 36 disposed on the surface of the InP contact layer 5, thereby forming the p-type region 6. A p-n junction or p-i junction 15 is formed at an end of the p-type region 6. A reverse bias voltage is applied to the p-n junction or p-i junction 15 to form a depletion layer which traps charges caused by photoelectric conversion, and thus the brightness of a pixel is made responsive to the amount of charges. The p-type region 6 or the p-n junction (p-i junction) 15 is a main part that constitutes a pixel. The p-side electrode 11 that is in ohmic-contact with the p-type region 6 is a pixel electrode, and the amount of charges is read, pixel by pixel, between the p-side electrode 11 and the n-side electrode 12 that is set at the ground voltage. On the surface of the InP contact layer that surrounds the p-type region 6, the selective diffusion mask pattern 36 is left as it is. Further, a passivation layer (not shown) composed of SiON or the like covers the selective diffusion mask pattern 36. The reason why the selective diffusion mask pattern 36 is left is as follows. After formation of the p-type region 6, if the selective diffusion mask pattern 36 is removed and the wafer is exposed to the atmosphere, a surface level is formed at the boundary between the surface of the p-type region and the surface of a region where the mask pattern 36 is removed from the contact layer, which causes an increase in dark current.

It is a point that, after formation of the MQW structure, growth is continued in the same deposition chamber or quartz tube 65 by all metal-organic source MOVPE until the InP contact layer 5 is formed. In other words, it is a point that no regrown interface is formed because the wafer 50a is not taken out from the deposition chamber before formation of the InP contact layer 5 to form the contact layer 5 by another deposition method. That is, since the InGaAs diffusive-concentration-distribution-adjusting layer 4 and the InP contact layer 5 are continuously formed in the quartz tube 65, the interfaces 16 and 17 are not regrown interfaces. Therefore, the oxygen concentration and the carbon concentration are both lower than $1 \times 10^{17}$ cm$^{-3}$, and no leakage current occurs particularly at a line where the p-type region 6 and the interface 17 intersect.

In the present embodiment, the non-doped InGaAs diffusive-concentration-distribution-adjusting layer 4 having a thickness of, for example, 1.0 µm is formed on the MQW absorption layer 3. After formation of the InP contact layer 5, when Zn as a p-type impurity is introduced from the InP contact layer 5 to reach the MQW absorption layer 3 by a selective diffusion method, if the high-concentration Zn enters the MQW structure, the crystallinity is degraded. The InGaAs diffusive-concentration-distribution-adjusting layer 4 is provided for adjusting the Zn diffusion. The InGaAs diffusive-concentration-distribution-adjusting layer 4 is not necessarily provided as described above.

The p-type region 6 is formed by the above-mentioned selective diffusion, and the p-n junction or p-i junction 15 is formed at an end of the p-type region 6. Even when the InGaAs diffusive-concentration-distribution-adjusting layer 4 is inserted, since the InGaAs has a small band gap, the electric resistance of the photodiode can be reduced even if the InGaAs is non-doped. The reduced electric resistance leads to an increase in responsivity, thereby realizing a moving picture of high image quality.

Preferably, the undoped InP contact layer 5 is epitaxially grown to a thickness of 0.8 µm on the InGaAs diffusive-concentration-distribution-adjusting layer 4 by all metal-organic source MOVPE, with the wafer 50a being placed in the same quartz tube 65. As described above, trimethylindium (TMIn) and tertiarybutylphosphine (TBP) are used as source gases. The use of these source gases allows the growth temperature of the InP contact layer 5 to be not lower than 400° C. but not higher than 560° C., and more preferably, not higher than 535° C. As a result, the GaAsSb in the MQW structure located under the InP contact layer 5 is not damaged by heat, and the crystallinity of the MQW structure is not degraded. When forming the InP contact layer 5, since the MQW structure including GaAsSb is disposed under the InP contact layer 5, the substrate temperature should be precisely maintained within a range of not lower than 400° C. but not higher than 560° C. The reason is as follows. If the wafer is heated to about 600° C., the GaAsSb is damaged by the heat, and its crystallinity is significantly degraded. In addition, if the InP contact layer is formed at a temperature lower than 400° C., the source gas decomposition efficiency is significantly reduced, and thereby the impurity concentration in the InP contact layer 5 is increased. Therefore, a high-quality InP contact layer 5 cannot be obtained.

As described above, conventionally, a MQW structure has to be formed by MBE. However, growth of an InP contact layer by MBE requires a solid source as a source of phosphorus, which leads to a problem in terms of safety or the like. Further, there is still a room for improvement in terms of manufacturing efficiency.

Prior to the present invention, the interface between the InGaAs diffusive-concentration-distribution-adjusting layer and the InP contact layer was a regrown interface once exposed to the atmosphere. The regrown interface can be identified when it satisfies either of the oxygen concentration of $1 \times 10^{17}$ cm$^{-3}$ or more and the carbon concentration of $1 \times 10^{17}$ cm$^{-3}$ or more, which concentrations can be confirmed by secondary ion mass spectrometry. The regrown interface and the p-type region form an intersection line, and leakage current occurs in the intersection line. Such leakage current significantly degrades the image quality.

Further, if the InP contact layer is grown by simple MOVPE, since phosphine (PH$_3$) is used as a source of phosphorus, the decomposition temperature is high. Such high decomposition temperature induces a thermal damage of the underlying GaAsSb, and thus the crystallinity of the MQW structure is degraded.

Figure 7:
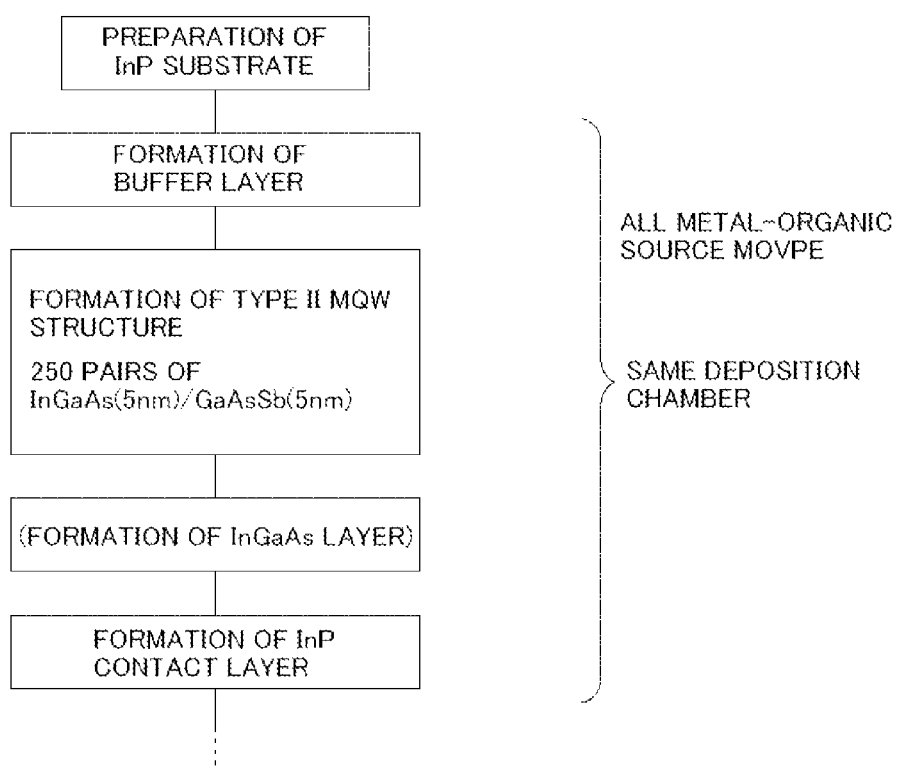
FIG. 7 is a flowchart of a method of manufacturing a photodiode 50 shown in FIG. 1.

FIG. 7 is a flowchart of a method of manufacturing the photodiode 50 shown in FIG. 1. According to the manufacturing method, it is important to decrease the growth temperature (deposition factor 2) by using only metal-organic gases as source gases (deposition factor 3), and to avoid formation of a regrown interface (deposition factor 4) by growing the layers consistently in the same deposition chamber or quartz tube 65 until formation of the InP contact layer 5 is completed. Thereby, photodiodes having less leakage current, excellent crystallinity, and detectivity in a wavelength region of 2 μm to 5 μm can be efficiently manufactured in large numbers.

Embodiment 2

Figure 8:
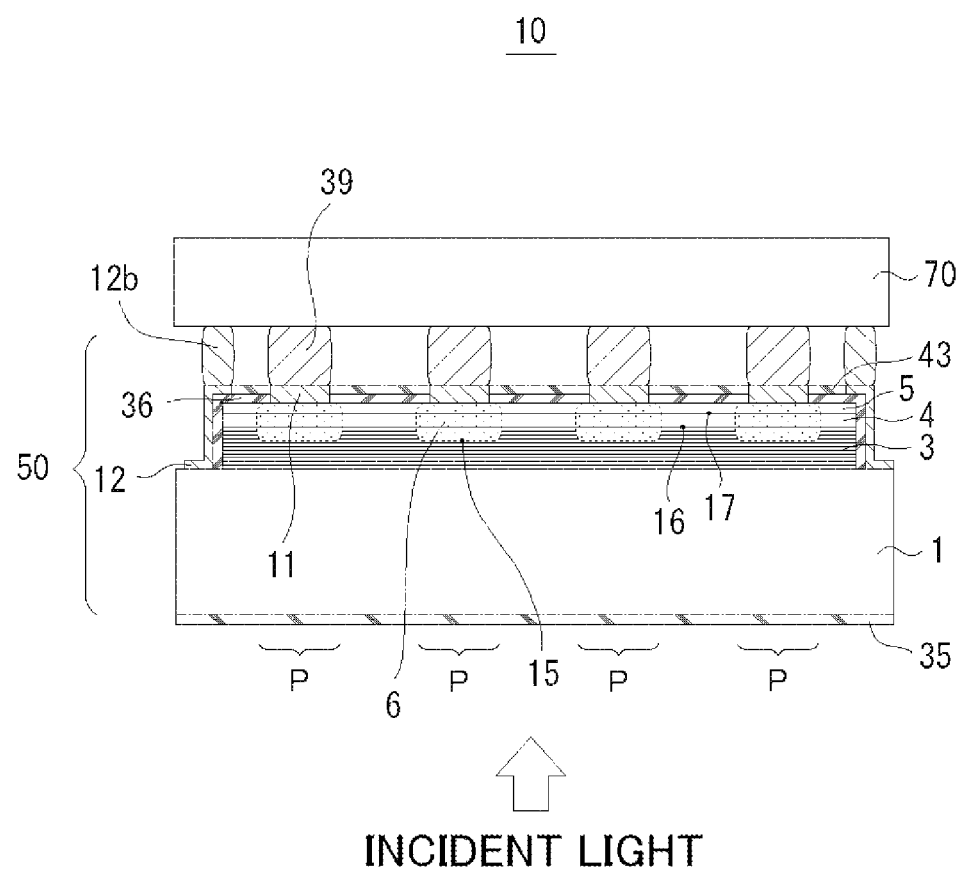
FIG. 8 is a diagram illustrating an optical sensor device including a photodiode array (semiconductor device) according to a second embodiment of the present invention.

FIG. 8 illustrates an optical sensor device 10 including a photodiode array (semiconductor device) 50 according to a second embodiment of the present invention. In FIG. 8, optical components such as lenses are omitted. Although a passivation layer 43 composed of an SiON layer is shown in FIG. 8, this passivation layer is actually provided in FIG. 1. The photodiode array 50 has the same layered structure as that of the photodiode shown in FIG. 1. The photodiode array 50 comprises a plurality of photodiodes or pixels P. Since the thickness z and the Sb composition x of the photodiode array 50 are identical to those of the semiconductor device shown in FIG. 1, repeated description is not necessary. Further, like the photodiode (semiconductor device) shown in FIG. 1, the interfaces 16 and 17 are not regrown interfaces, and the impurity concentrations of oxygen, carbon, and the like are low.

In FIG. 8, the photodiode array 50 and a CMOS 70 constituting a readout IC are connected. Readout electrodes (not shown) of the CMOS 70 and pixel electrodes (p-side electrodes) 11 of the photodiode array 50 are connected via interconnection bumps 39. A ground electrode (n-side electrode) 12 common to the pixels of the photodiode array 50, and a ground electrode (not shown) of the CMOS 70 are connected via a bump 12b. It is possible to realize an imaging device or the like by combining the CMOS 70 and the photodiode array 50, and integrating, pixel by pixel, light absorption information.

As described above, the photodiode array (semiconductor device) 50 of the present invention has detectivity in the long wavelength region, and reduced dark current (leakage current). Therefore, when applied to biological tests for animals and plants, environmental monitoring, and the like, the photodiode array (semiconductor device) 50 can execute highly precise examination.

EXAMPLES

Example 1

Samples were prepared by varying the thickness z (nm) and the Sb composition x (%) of GaAsSb in the MQW structure of the photodiode 50 having the same structure as the semiconductor device 50 shown in FIG. 1, and the PL (Photo-Luminescent) wavelength and the dark current of each sample were measured at room temperature. Table I shows the Sb composition x of GaAsSb, the In composition y of InGaAs, and the thickness z (nm) of GaAsSb and InGaAs of each sample. The GaAsSb and the InGaAs have the same thickness. Further, assuming that the lattice mismatch of the InGaAs is $\Delta\omega_1$ and the lattice mismatch of the GaAsSb is $\Delta\omega_2$, the lattice mismatch $\Delta\omega$ of the entire MQW structure is defined by $\Delta\omega=\{\Sigma(\Delta\omega_1 \times \text{InGaAs thickness} + \Delta\omega_2 \times \text{GaAsSb thickness})\}/\{\Sigma(\text{InGaAs thickness}+\text{GaAsSb thickness})\}$. The composition x and the composition y are set so that the lattice mismatch $\Delta\omega$ is not smaller than −0.2% but not greater than 0.2%.

Each photodiode 50 was manufactured by all metal-organic source MOVPE as described above. The part other than the absorption layer was manufactured by the above-mentioned method. The major epitaxial layers were manufactured as follows. The growth temperature was 510° C. As for the GaAsSb, TEGa, TBAs, and TESb were used as sources, and the Sb composition x was varied by varying the supply ratio of TBAs to TESb with the V/III ratio (supply of group V sources/supply of group III sources) being kept constant. As for the InGaAs, TEGa, TMIn, and TBAs were used as sources, and the In composition y was varied by varying the supply ratio of TEGa to TMIn with the V/III ratio being kept constant. Further, as for the InP contact layer 5, TMIn and TBP were used as sources.

TABLE I

| Sample | Sb composition x(at. %) of GaAsSb | In composition y(at. %) of InGaAs | Thickness z(nm) of InGaAs, GaAsSb | PL wavelength (nm) at room temperature | Dark current (nA) of photodiode 100 μm dia. Vr = 1 V |
|---|---|---|---|---|---|
| Invention Example 1 | 44.2 | 58 | 7 | 2490 | 50 |
| Comparative Example 2 | 44.1 | 58.3 | 5 | 2210 | 30 |
| Comparative Example 3 | 46.3 | 56 | 5 | 2290 | 30 |
| Invention Example 4 | 49 | 53 | 10 | 2870 | 100 |
| Invention Example 5 | 48.6 | 53 | 7 | 2700 | 80 |
| Invention Example 6 | 49.1 | 53 | 6 | 2620 | 50 |
| Invention Example 7 | 49 | 53 | 5 | 2430 | 40 |
| Comparative Example 8 | 49 | 53.2 | 3.5 | 2210 | 20 |
| Invention Example 9 | 51.8 | 49.7 | 5 | 2520 | 70 |
| Comparative Example 10 | 52.2 | 49.8 | 3.5 | 2300 | 50 |
| Invention Example 11 | 54.3 | 47.2 | 7 | 2860 | 200 |
| Invention Example 12 | 54 | 47.4 | 5 | 2630 | 100 |
| Invention Example 13 | 54.1 | 47 | 3.5 | 2410 | 80 |
| Invention Example 14 | 58 | 43.2 | 5 | 2790 | 200 |
| Invention Example 15 | 57.7 | 43 | 3.5 | 2580 | 150 |
| Invention Example 16 | 61.6 | 37.7 | 7 | 3160 | 700 |
| Invention Example 17 | 61.8 | 38 | 5 | 2980 | 300 |
| Invention Example 18 | 62 | 38.1 | 3.5 | 2770 | 200 |
| Invention Example 19 | 64.8 | 35.2 | 5 | 3100 | 800 |

<Evaluation>

The PL wavelength at room temperature, and the dark current were measured as follows. The dark current was measured under the condition that the absorption diameter was 100 μm, and the reverse bias voltage (Vr) was 1V.

1. PL Wavelength at Room Temperature

Figure 9:
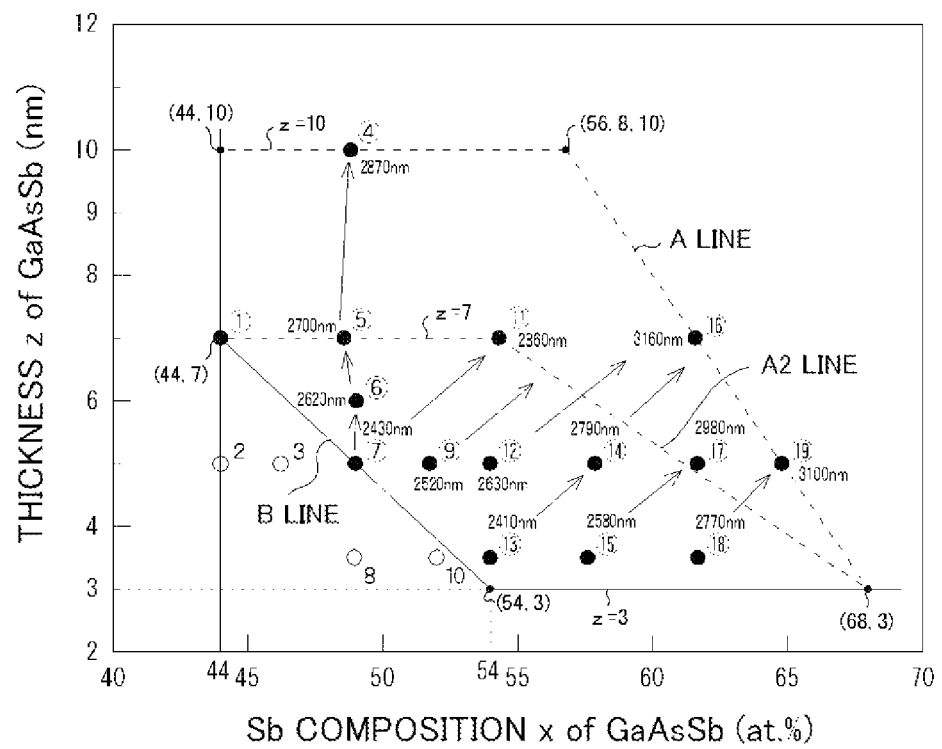
FIG. 9 is a diagram illustrating the positions of samples and PL wavelengths thereof, in the relationship between the Sb composition x of GaAsSb and the thickness z (nm) thereof in an MQW structure according to Example 1. A line indicates z=−0.625x+45.5, A2 line indicates z=−0.27x+21.7, and B line indicates z=−0.4x+24.6.

The PL wavelength at room temperature corresponds to the band gap wavelength, and corresponds to the maximum wavelength that can be almost absorbed. With reference to FIGS. 9 and 4, in Comparative Examples 2, 3, 8 and 10, the thicknesses z thereof are positioned under the B line: $-0.4x+24.6$. According to Table I, the PL wavelengths thereof are 2210 nm, 2290 nm, 2210 nm and 2300 nm, respectively, which are smaller than 2400 nm.

This is because the thicknesses z and the Sb compositions x of GaAsSb are not sufficiently large.

In contrast, in a range where the thickness z is not smaller than 3 nm ($z \geq 3$) and is not smaller than $-0.4x+24.6$ ($z \geq -0.4x+24.6$), i.e., on or higher than the B line, as shown in Table I, all Invention Examples achieve the PL wavelengths longer than 2.4 μm. Furthermore, as the thickness z approaches the A line: $z=-0.625x+45.5$, the PL wavelength shifts toward longer wavelengths. In FIG. 9, it is indicated by arrows and PL wavelengths that the PL wavelengths increase as the thickness z approaches the A line and the line of z=10.

Further, as the thickness z approaches the line of z=10, the PL wavelength increases in the order of Invention Example 7 (2430 nm)→Invention Example 6 (2620 nm)→Invention Example 5 (2700 nm)→Invention Example 4 (2870 nm).

2. Dark Current

The dark current is limited by the A line: $z=-0.625x+45.5$. Since the dark current increases with an increase in the lattice defect density, it is often considered that the dark current is caused by only the Sb composition x and the In composition y. However, as described above, the dark current also depends on the thickness, and is influenced by not only the compositions x and y but by the thickness z. This is because the lattice defect is accumulated.

Invention Examples 16 and 19 are positioned on the A line, and have dark currents of 700 nA and 800 nA, respectively. This level of dark current is allowable in many applications. However, when the dark current is emphasized, the thickness z is preferably lower than the A line. In order to further reduce the dark current with reliability, the thickness z should be on or lower than the A2 line: $z=-0.27x+21.7$. In this case, Invention Examples 16 and 19 are outside the scope of the present invention, and are regarded as Comparative Examples.

In a range a little apart from the A line, for example, Invention Examples 11, 14, 17 and 18 have dark currents of 200 nA, 200 nA, 300 nA and 200 nA, respectively, which cause no problem in practical applications.

3. Detectivity

Although it will be later described for Example 2, if the thickness z of the GaAsSb reaches 10 nm, the detectivity degrades. Since a certain level of detectivity is achieved even when the thickness z is 10 nm, this thickness z is allowed in some applications. However, if the detectivity is significantly concerned, the thickness z should be smaller than 10 nm. If higher detectivity is desired, $z \leq 7$ (nm) should be satisfied. In this case, Invention Example 4 is outside the scope of the present invention.

This is a quantum-mechanical effect, and is true regardless of the conditions of Examples. Also when the thickness z is as small as 2 nm, the detectivity is low. Therefore, the thickness z is 3 nm or more.

Example 2

Manufacturing of Samples

On an S-doped InP substrate, epitaxial layers including a buffer layer (InP/InGaAs), a type II (InGaAs/GaAsSb) MQW absorption layer, an InGaAs diffusive-concentration-distribution-adjusting layer, and an InP contact layer were consistently formed by all metal-organic source MOVPE. An InP contact layer was grown directly on the MQW absorption layer 3. TEGa, TMIn, TBAs, TBP and TMSb were used as sources of Ga, In, As, P and Sb, respectively. TeESi was used as an n-type impurity dopant.

Specifically, an n-doped InP buffer layer was grown to a thickness of 150 nm on an S-doped InP substrate, and an n-doped InGaAs buffer layer was grown to a thickness of 0.15 μm on the n-doped InP buffer layer. On the two buffer layers, a type II (InGaAs/GaAsSb) MQW absorption layer was grown. In the MQW structure, a lower-side non-doped InGaAs layer and a non-doped GaAsSb layer were paired, and 250 pairs were repeated. The composition was determined so that each layer solely achieves lattice match. The Sb composition x of the GaAsSb was 49%, and the In composition y of the InGaAs was 53%. Assuming that the lattice mismatch of the InGaAs is $\Delta\omega_1$ and the lattice mismatch of the GaAsSb is $\Delta\omega_2$, the lattice mismatch $\Delta\omega$ of the entire MQW structure is defined by $\Delta\omega=\{\Sigma(\Delta\omega_1\times\text{InGaAs thickness}+\Delta\omega_2\times\text{GaAsSb thickness})\}/\{\Sigma(\text{InGaAs thickness}+\text{GaAsSb thickness})\}$. The lattice mismatch $\Delta\omega$ is not smaller than −0.2% but not greater than 0.2%. An InGaAs diffusive-concentration-distribution-adjusting layer was grown to a thickness of 1.0 μm on the MQW absorption layer, and a non-doped InP contact layer was grown to a thickness of 0.8 μm on the diffusive-concentration-distribution-adjusting layer. For the growth of the GaAsSb, TEGa, TBAs and TMSb were used as sources. For the growth of the InGaAs, TEBa, TMIn and TBAs were used. Further, for the growth of the InP contact layer and the InP buffer layer, TMIn and TBP were used.

On the other hand, the PL wavelength increased with an increase in the thicknesses of the InGaAs and the GaAsSb. When the thicknesses of both layers were 10 nm, the PL wavelength was 2.9 μm.

2. Detectivity

Detectivity measurement was performed for light having a wavelength of 2000 nm, at a reverse bias voltage Vr=5V. When the thicknesses of the GaAsSb and the InGaAs were 2 nm, the detectivity was as very low as 0.1 A/W. When the thicknesses of both layers were increased to 3 nm, 5 nm, and 7 nm, the detectivity was improved to 0.6 A/W, 0.6 A/W, and 0.5 A/W, respectively. When the thicknesses of both layers were 10 nm, the detectivity was degraded to 0.2 A/W.

Example 3

Samples having the structure of Example 2 were manufactured according to the same procedure. However, in Example 3, the thicknesses of the GaAsSb and the InGaAs were fixed to 5 nm, and the supply of source gases was controlled as described above. Assuming that the lattice mismatch of the InGaAs is $\Delta\omega_1$ and the lattice mismatch of the GaAsSb is $\Delta\omega_2$, the lattice mismatch $\Delta\omega$ of the entire MQW structure is defined by $\Delta\omega=\{\Sigma(\Delta\omega_1\times\text{InGaAs thickness}+\Delta\omega_2\times\text{GaAsSb thickness})\}/\{\Sigma(\text{InGaAs thickness}+\text{GaAsSb thickness})\}$. The lattice mismatch $\Delta\omega$ is not smaller than −0.2% but not greater than 0.2%.

TABLE II

|  |  | Sample | | | | |
| --- | --- | --- | --- | --- | --- | --- |
|  |  | Comparative Example A1 | Comparative Exame A2 | Invention Example A3 | Invention Example A4 | Invention Example A5 |
| Structure | Thickness z(nm) of InGaAs, GaAsSb | 2 | 3 | 5 | 7 | 10 |
| Evaluation | PL peak wavelength (μm) at room temperature | 1.9 | 2.1 | 2.5 | 2.7 | 2.9 |
|  | Detectivity (A/W) of photodiode 1 mm dia. Vr = 5 V λ = 2000 nm | 0.1 | 0.6 | 0.6 | 0.5 | 0.2 |

<Evaluation>

1. PL Characteristics

Figure 10:
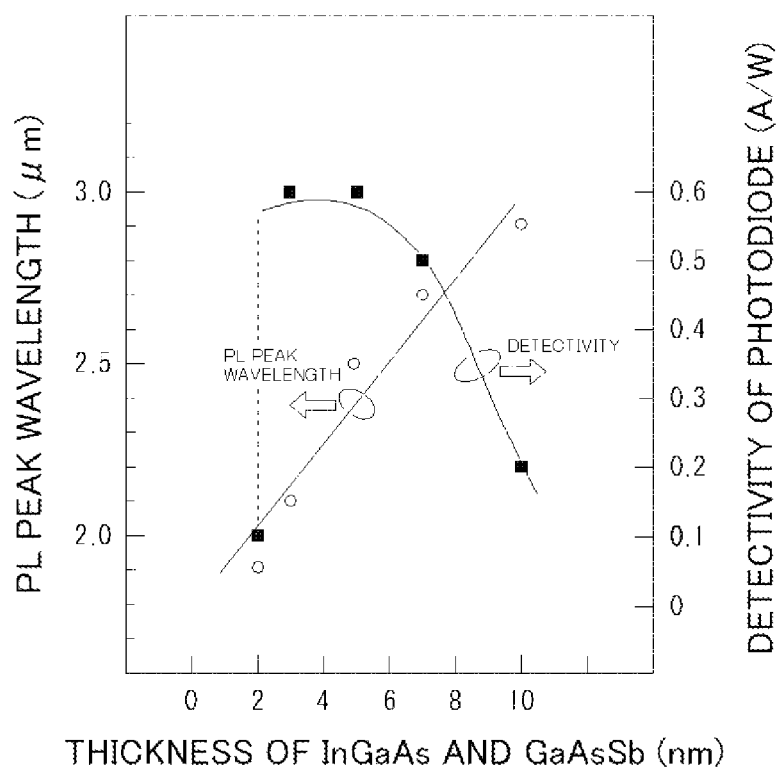
FIG. 10 is a diagram illustrating the relationship between the quantum-well-thicknesses of samples in Example 2, and the PL wavelengths and detectivities thereof.

Results are shown in Table II and FIG. 10. When the thickness z of the GaAsSb and the thickness of the InGaAs were 5 nm, the PL peak wavelength was 2.5 μm. As the thicknesses of both layers were decreased, the PL wavelength shifted toward the shorter wavelengths. When the thicknesses of the GaAsSb and the InGaAs were 2 nm, the PL wavelength was 1.9 μm.

TABLE III

|  |  | Sample | | | | |
| --- | --- | --- | --- | --- | --- | --- |
|  |  | Invention Example B1 | Invention Example B2 | Invention Example B3 | Invention Example B4 | Invention Example B5 |
| Structure | In composition y(at. %) of InGaAs | 53 | 50 | 47 | 43 | 38 |
|  | Sb composition x(at. %) of GaAsSb | 49 | 52 | 54 | 58 | 62 |
| Evaluation | PL peak wavelength (μm) at room temperature | 2.4 | 2.5 | 2.6 | 2.8 | 3.0 |
|  | Dark current (nA) of photodiode 100 μm dia. Vr = 1 V | 40 (excellent characteristics) | 70 (excellent characteristics) | 100 (excellent characteristics) | 200 (excellent characteristics) | 300 (excellent characteristics) |
|  | Dark current (nA) of photodiode 100 μm dia. Vr = 5 V | 50 (excellent characteristics) | 100 (excellent characteristics) | 200 (excellent characteristics) | 500 (excellent characteristics) | 800 (excellent characteristics) |

<Evaluation>
1. PL Characteristics

Figure 11:
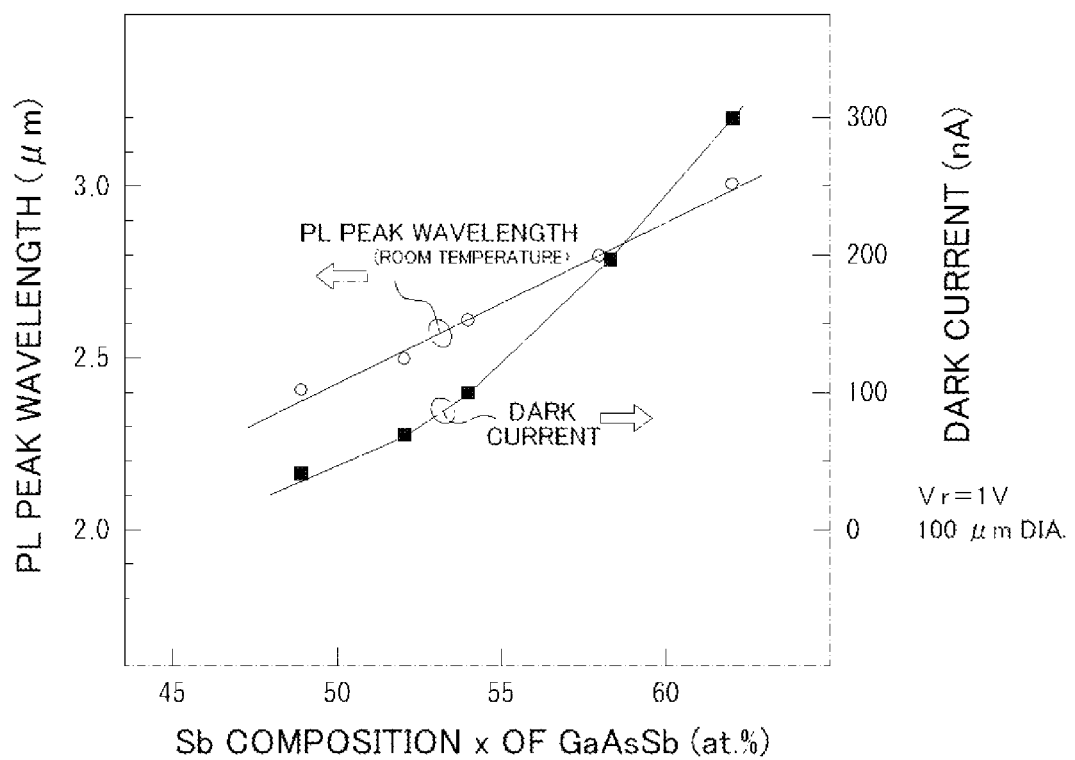
FIG. 11 is a diagram illustrating the relationship between the Sb compositions x of GaAsSb in MQW structures of samples in Example 3, and the PL wavelengths and dark currents (reverse bias voltage Vr=1V) thereof.

Results are shown in Table III and FIG. 11. When the Sb composition x of the GaAsSb was 49% and the In composition y of the InGaAs was 53%, the PL wavelength was 2.4 µm. When the Sb composition x of the GaAsSb was increased and the In composition y of the InGaAs was decreased, the PL wavelength shifted toward longer wavelengths.

When the Sb composition x was 62% and the In composition y was 38%, the PL wavelength was 3.0 µm.

2. Dark Current

Regardless of whether the reverse bias voltage Vr was 1V or 5V, when the Sb composition was increased from 44%, the dark current was gradually increased. However, this dark current was at a favorable level. When the In composition y was lower than 53% and the Sb composition was increased from 62%, a difference between the dark current at the reverse bias voltage Vr of 1V and the dark current at the reverse bias voltage Vr of 5V was increased. Therefore, in order to increase the S/N ratio in a photodiode having the detectivity in the longer wavelength region, it is desirable that the reverse bias voltage is reduced (the absolute value thereof is reduced).

Embodiments and Examples of the present invention have been described above. However, the embodiments and the examples of the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

INDUSTRIAL APPLICABILITY

According to the semiconductor device of the present invention, it is possible to extend the detectivity toward longer wavelengths in the near-infrared region by increasing the Sb composition (decreasing the In composition) and increasing the thickness of each quantum well, while reducing the dark current to a level that causes no problem in practical applications, and while controlling the Sb and In compositions so that the InP lattice match conditions are satisfied by both the GaAsSb and the InGaAs in combination. As a result, the semiconductor device becomes applicable to important applications. Further, by growing the layers consistently in the same growth chamber by all metal-organic source MOVPE, contamination due to impurities is avoided, resulting in high-quality crystallinity. Further, the sharpness of the composition between the quantum wells in the MQW absorption layer can be increased, which enables highly-precise execution of absorption spectrum analysis or the like.

DESCRIPTION OF THE REFERENCE CHARACTERS

1 InP substrate
2 buffer layer (InP and/or InGaAs)
3 type II MQW absorption layer
4 InGaAs layer (diffusive-concentration-distribution-adjusting layer)
5 InP contact layer
6 p-type region
10 optical sensor device (detection device)
11 p-side electrode (pixel electrode)
12 ground electrode (n-side electrode)
12b bump
15 p-n junction
16 interface between MQW and InGaAs layer
17 interface between InGaAs layer and InP contact layer
35 AR (Anti-Reflection) layer
36 selective diffusion mask pattern
39 interconnection bump
43 passivation layer (SiON layer)
50 photodiode (photodiode array)
50a wafer (interim product)
60 growth system for all metal-organic source MOVPE
61 IR temperature monitor
63 reaction chamber
65 quartz tube
69 window of reaction chamber
66 substrate table
66h heater
70 CMOS
P pixel

The invention claimed is:

1. A semiconductor device formed on an InP substrate, comprising:
an absorption layer of a type II multiple quantum well structure, located on the InP substrate, wherein
the multiple quantum well structure is a strain-compensated structure composed of a repetition of a $GaAs_{1-x}Sb_x$ layer and an $In_yGa_{1-y}As$ layer, and
the $GaAs_{1-x}Sb_x$ layer has an Sb composition x (at. %) and a thickness z (nm) which satisfy relationships (1) to (2) below:

$$44 \text{ at. }\% \leq x \leq 54.3 \text{ at. }\%, \text{ and} \quad (1)$$

$$7 \text{ nm} \leq z < 10 \text{ nm}, \quad (2)$$

wherein in a maximum wavelength at which the absorption layer has detectivity is not shorter than 2.4 µm, and
wherein the Sb composition x of the $GaAs_{1-x}Sb_x$ layer and an In composition y (at. %) of the $In_yGa_{1-y}As$ layer satisfy $100 \leq x+y \leq 104$.

2. The semiconductor device according to claim 1, including an InP contact layer on the multiple quantum well structure.

3. The semiconductor device according to claim 1, wherein when, in the multiple quantum well structure, a lattice mismatch of the $In_yGa_{1-y}As$ layer is $\Delta\omega_1$ and a lattice mismatch of the $GaAs_{1-x}Sb_x$ layer is $\Delta\omega_2$, a lattice mismatch $\Delta\omega$ of the entire multiple quantum well structure is defined by $\Delta\omega=\{\Sigma(\Delta\omega_1 \times \text{thickness of the } In_yGa_{1-y}As \text{ layer} + \Delta\omega_2 \times \text{thickness of the } GaAs_{1-x}Sb_x \text{ layer})\}/\{\Sigma(\text{thickness of the } In_yGa_{1-y}As \text{ layer} + \text{thickness of the } GaAs_{1-x}Sb_x \text{ layer})\}$, and the $\Delta\omega$ is not smaller than −0.2% but not greater than 0.2%.

4. The semiconductor device according to claim 3, wherein there is no regrown interface between a bottom surface of the absorption layer and an upper surface of a semiconductor layer including the absorption layer and the InP contact layer.

5. An optical sensor device adopting, as a photodiode, the semiconductor device according to claim 1.

6. A method of manufacturing a semiconductor device on an InP substrate, comprising:
a step of forming an absorption layer of a type II multiple quantum well structure on the InP substrate, wherein
the multiple quantum well structure is a strain-compensated structure composed of a $GaAs_{1-x}Sb_x$ layer and an $In_yGa_{1-y}As$ layer, and in the step of forming the multiple quantum well structure, an Sb composition x (at. %) and a thickness z (nm) of the $GaAs_{1-x}Sb_x$ layer satisfy relationships (1) to (2) below:

$$44 \text{ at. }\% \leq x \leq 54.3 \text{ at. }\%, \text{ and} \quad (1)$$

$$7 \text{ nm} \leq z < 10 \text{ nm}, \quad (2)$$

wherein in a maximum wavelength at which the absorption layer has detectivity is not shorter than 2.4 μm, and wherein the Sb composition x of the $GaAs_{1-x}Sb_x$ layer and an In composition y (at. %) of the $In_yGaAs_{1-y}$ layer satisfy $100 \leq x+y \leq 104$.

7. The method of manufacturing a semiconductor device according to claim 6, wherein an In composition y (at. %) of the $In_yGa_{1-y}As$ layer is decreased at a rate of 0.9 to 1.2 per increase of 1 at. % of the Sb composition x of the $GaAs_{1-x}Sb_x$ layer.

8. The method of manufacturing a semiconductor device according to claim 6, wherein in the step of forming the multiple quantum well structure, the multiple quantum well structure is formed at a temperature not lower than 400° C. but not higher than 560° C.

* * * * *

UNITED STATES PATENT AND TRADEMARK OFFICE
CERTIFICATE OF CORRECTION

PATENT NO. : 9,818,895 B2  
APPLICATION NO. : 14/694278  
DATED : November 14, 2017  
INVENTOR(S) : Kei Fujii et al.

It is certified that error appears in the above-identified patent and that said Letters Patent is hereby corrected as shown below:

In the Claims

- In Claim 1, Column 24, Line 40, "$In_xGa_{1-y}As$" should be -- $In_yGa_{1-y}As$ --

- In Claim 6, Column 25, Line 12, "$In_yGaAs_{1-y}$" should be -- $In_yGa_{1-y}As$ --

Signed and Sealed this  
Thirteenth Day of March, 2018

Andrei Iancu  
*Director of the United States Patent and Trademark Office*